United States Patent
Han et al.

(10) Patent No.: US 11,990,543 B2
(45) Date of Patent: *May 21, 2024

(54) POWER TRANSISTOR WITH SOFT RECOVERY BODY DIODE

(71) Applicant: Wolfspeed, Inc., Durham, NC (US)

(72) Inventors: Kijeong Han, Apex, NC (US); Sei-Hyung Ryu, Cary, NC (US); Daniel Jenner Lichtenwalner, Raleigh, NC (US)

(73) Assignee: Wolfspeed, Inc., Durham, NC (US)

( * ) Notice: Subject to any disclaimer, the term of this patent is extended or adjusted under 35 U.S.C. 154(b) by 386 days.

This patent is subject to a terminal disclaimer.

(21) Appl. No.: 17/208,271

(22) Filed: Mar. 22, 2021

(65) Prior Publication Data
US 2022/0173238 A1 Jun. 2, 2022

Related U.S. Application Data

(63) Continuation-in-part of application No. 17/110,027, filed on Dec. 2, 2020.

(51) Int. Cl.
*H01L 29/78* (2006.01)
*H01L 29/16* (2006.01)

(52) U.S. Cl.
CPC ...... *H01L 29/7805* (2013.01); *H01L 29/1608* (2013.01)

(58) Field of Classification Search
CPC ............. H01L 29/7804; H01L 27/0255; H01L 29/1608; H01L 29/66712; H01L 29/66068; H01L 29/32; H01L 29/0878; H01L 29/1095; H01L 29/7802
See application file for complete search history.

(56) References Cited

U.S. PATENT DOCUMENTS

| | | |
|---|---|---|
| 2004/0195618 A1 | 10/2004 | Saito et al. |
| 2007/0048982 A1 | 3/2007 | Nemoto et al. |
| 2009/0057711 A1 | 3/2009 | Chen |
| 2015/0014764 A1 | 1/2015 | Tamura et al. |
| 2015/0311325 A1* | 10/2015 | Zhang ................. H01L 29/0619 257/77 |
| 2016/0035881 A1* | 2/2016 | Tamura ............... H01L 29/1095 257/329 |
| 2016/0307993 A1* | 10/2016 | Kuribayashi ........... H01L 29/47 |
| 2017/0213908 A1 | 7/2017 | Fursin et al. |
| 2018/0233564 A1 | 8/2018 | Kumada et al. |
| 2022/0109049 A1* | 4/2022 | Miyazato .............. H01L 29/105 |

FOREIGN PATENT DOCUMENTS

DE 102007019551 A1 10/2008

OTHER PUBLICATIONS

International Search Report and Written Opinion for International Patent Application No. PCT/US2021/060286, dated May 19, 2022, 32 pages.

(Continued)

*Primary Examiner* — Mohammed R Alam
(74) *Attorney, Agent, or Firm* — Myers Bigel, P.A.

(57) ABSTRACT

A semiconductor device includes a vertical transistor and a body diode. Various improvements to the semiconductor device allow for improved performance of the body diode, in particular to reduced snappiness and increased softness.

31 Claims, 25 Drawing Sheets

(56) References Cited

OTHER PUBLICATIONS

Baliga, Jayant, "Fundamental of Power Semiconductor Devices," 2nd Edition, Springer, 1114 pages.

Cova, et al., "Power p-i-n diodes for snubberless application: H+ irradiation for soft and reliable reverse recovery," Microelectronics Reliability, vol. 43, 2003, pp. 81-87.

Hayashi, et al., "Temperature and injection level dependencies and impact of thermal oxidation on carrier lifetimes in p-type and ntype 4H-SiC epilayers," Journal of Applied Physics, vol. 109, 2011, 5 pages.

Hazdra, et al., "Local lifetime control by light ion irradiation: impact on blocking capability of power P-i-N diode," Microelectronics Journal, vol. 32, 2001, pp. 449-456.

Kimoto, et al., "Impacts of recombination at the surface and in the substrate on carrier lifetimes of n-type 4H-SiC epilayers," Journal of Applied Physics, vol. 108, 2010, 7 pages.

Leveque, et al., "Identification of hydrogen related defects in proton implanted float-zone silicon," European Physical Journal: Applied Physics, vol. 23, 2003, pp. 5-9.

Rahimo, et al., "Freewheeling Diode Reverse Recovery Failure Modes in IGBT Applications," IEEE Transactions on Industry Applications, vol. 37, 2001, 10 pages.

Ryu, et al., "Impact of Carrier Lifetime Enhancement Using High Temperature Oxidation on 15kV 4H-SiC P-GTO Thyristor," Materials Science Forum, vol. 897, pp. 587-590.

Cheng, et al., "Fast Reverse Recovery Body Diode in High-Voltage VDMOSFET Using Cell-Distributed Schottky Contacts," IEEE Transactions on Electron Devices, vol. 50, Issue 5, May 2003, pp. 1422-1425.

Lai, et al., "Characteristics and Utilization of a New Class of Low On-Resistance MOS-Gated Power Device," IEEE Industry Applications Conference, Oct. 3-7, 1999, pp. 1073-1079.

Saito, et al., "Semisuperjunction MOSFETs: New Design Concept for Lower On-Resistance and Softer Reverse-Recovery Body Diode," IEEE Transactions on Electron Devices, vol. 50, Issue 8, Aug. 2003, pp. 1801-1806.

Schmitt, et al., "A Comparison of Electron, Proton and Helium Ion Irradiation for the Optimization of the CoolMOS Body Diode," International Symposium on Power Semiconductor Devices, Santa Fe, New Mexico, Jun. 2002, pp. 229-232.

Invitation to Pay Additional Fees and Partial Search for International Patent Application No. PCT/US2021/060286, dated Feb. 16, 2022, 20 pages.

\* cited by examiner

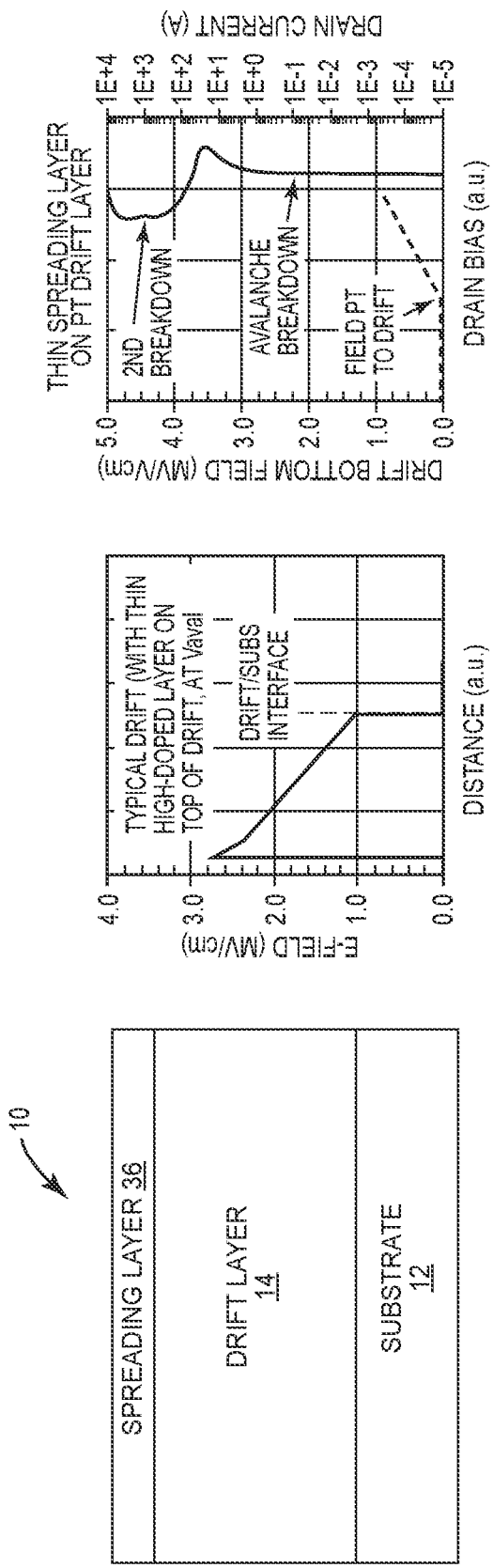

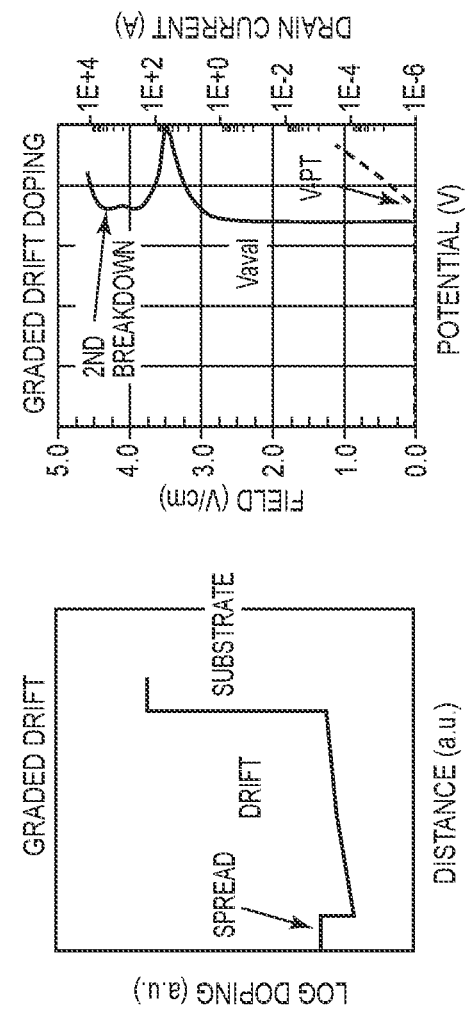
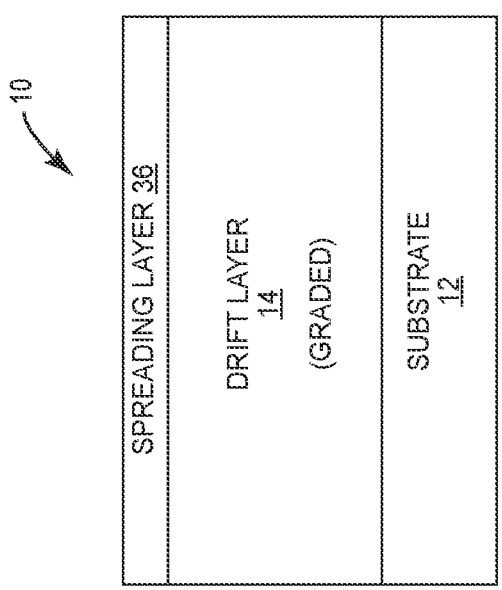
FIG. 17C
FIG. 17B
FIG. 17A

POWER TRANSISTOR WITH SOFT RECOVERY BODY DIODE

RELATED APPLICATIONS

This application is a continuation-in-part of U.S. patent application Ser. No. 17/110,027, filed Dec. 2, 2020, the disclosure of which is hereby incorporated herein by reference in its entirety.

FIELD OF THE DISCLOSURE

The present disclosure relates to semiconductor devices, and in particular to power transistors including a body diode having soft recovery characteristics and methods for manufacturing the same.

BACKGROUND

Transistors have numerous applications in modern electronics. Power transistors, which are transistors that are capable of handling high voltages and currents, are often used in switching circuitry for delivering power to a load. Transistors used in power switching circuitry generally need to be capable of conducting current bidirectionally. Accordingly, an anti-parallel diode is provided in conjunction with a transistor in power switching circuitry. In the case of a metal-oxide-semiconductor field-effect transistor (MOSFET), an anode of the anti-parallel diode is coupled to a drain of the MOSFET and a cathode of the anti-parallel diode is coupled to a source of the MOSFET. This allows current to flow from the drain to the source in the MOSFET during a forward conduction mode of operation and from the source to the drain via the anti-parallel diode in a reverse conduction mode of operation. When switching between conducting and blocking in the anti-parallel diode, performance characteristics of the anti-parallel diode will determine the speed at which such a transition can occur and the switching losses that occur. It is generally desirable to minimize both the transition time between modes of operation and the switching losses. Accordingly, there is a present need for an anti-parallel diode for use in conjunction with a transistor to improve switching speeds and reduce switching losses.

SUMMARY

In one embodiment, a semiconductor device includes a substrate, a drift layer, and one or more implanted regions in the drift layer. The drift layer has a carrier lifetime between 1 μs and 20 μs. The one or more implanted regions are configured to provide a vertical transistor device and a body diode. The vertical transistor device is configured to conduct current in a first direction, while the body diode is configured to conduct current in a second direction opposite the first direction. By providing the drift layer with a carrier lifetime between 1 μs and 20 μs, a softness of the body diode can be improved, which may in turn reduce switching losses associated with the semiconductor device.

In one embodiment, a softness factor of the body diode is between 0.5 and 10. As discussed above, this may reduce switching losses associated with the semiconductor device. The semiconductor device may include a recombination region in the drift layer, which is an area having a density of minority carrier recombination centers that is between $1 \times 10^{13}$ cm$^{-3}$ and $1 \times 10^{18}$ cm$^{-3}$. The body diode may be provided such that it is a non-punch through diode.

In one embodiment, a semiconductor device includes a substrate, a drift layer, one or more implanted regions in the drift layer, and a recombination region in the drift layer. The one or more implanted regions are configured to provide a vertical transistor device and a body diode. The vertical transistor device is configured to conduct current in a first direction, while the body diode is configured to conduct current in a second direction opposite the first direction. The recombination region borders the one or more implanted regions in the drift layer and has a density of minority carrier recombination centers between $1 \times 10^{13}$ cm$^{-3}$ and $1 \times 10^{18}$ cm$^{-3}$. The recombination region may improve the softness of the body diode, which may in turn reduce switching losses associated with the semiconductor device.

In one embodiment, a softness factor of the body diode is between 0.5 and 10. The drift layer may have a carrier lifetime between 1 μs and 20 μs. The body diode may be provided such that it is a non-punch through diode.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIG. 13A illustrates a semiconductor device according to one embodiment of the present disclosure.

FIG. 13B is a graph illustrating the electric field in the vertical semiconductor device for the embodiment of FIG. 13A.

FIG. 13C is graph illustrating the electric field at the bottom of the drift layer and the drain-source current as the drain-source voltage increases in a blocking state for the embodiment of FIG. 13A.

FIG. 17A illustrates a semiconductor device according to one embodiment of the present disclosure.

FIG. 17B is a graph illustrating the relative graded doping centration levels throughout the various layers of the vertical semiconductor device for the embodiment of FIG. 17A.

FIG. 17C is a graph illustrating the electric field at the bottom of the drift layer and the drain-source current as the drain-source voltage increases in a blocking state for the embodiment of FIG. 17A.

DETAILED DESCRIPTION

Figure 1:
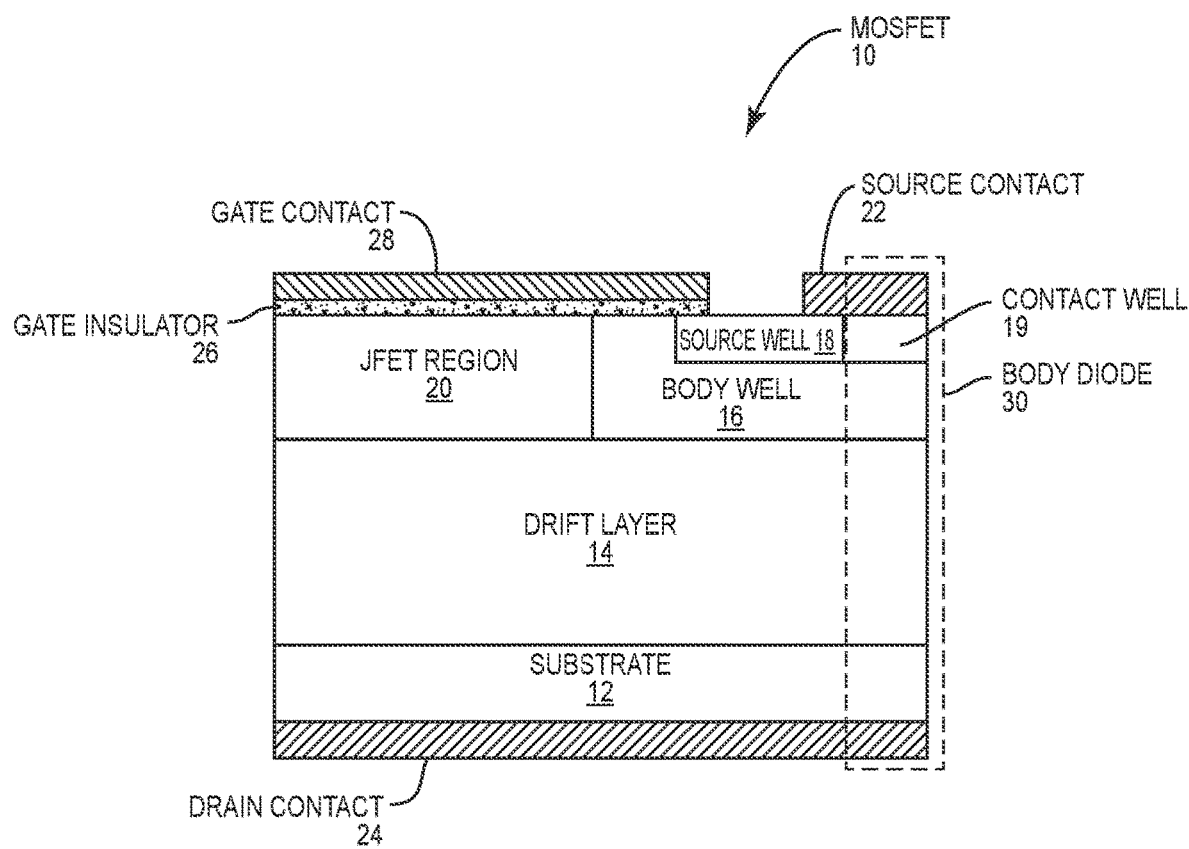
FIG. 1 illustrates a cross-sectional view of a transistor according to one embodiment of the present disclosure.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

FIG. 1 is a cross-sectional view of a transistor 10 according to one embodiment of the present disclosure. The transistor 10 includes a substrate 12 and a drift layer 14 on the substrate 12. A body well 16 is provided in a surface of the drift layer 14 opposite the substrate 12. A source well 18 is provided in the body well 16 such that the source well 18 is within the body well 16. A contact well 19 is also provided in the body well 16 such that the contact well 19 is adjacent to the source well 18 in the body well 16. A junction field-effect transistor (JFET) region 20 is also provided in the surface of the drift layer 14 opposite the substrate 12, adjacent to the body well 16. A source contact 22 is provided on the drift layer 14 opposite the substrate 12 such that the source contact 22 is in electrical contact with the source well 18, and the body well 16 via the contact well 19. A drain contact 24 is provided on the substrate 12 such that it is in electrical contact with the substrate 12. A gate insulator 26 is provided on the surface of the drift layer 14 opposite the substrate 12 such that the gate insulator 26 is over the JFET region 20, a portion of the body well 16, and a portion of the source well 18. A gate contact 28 is on the gate insulator 26.

In one embodiment, the transistor 10 is an n-type device wherein the substrate 12, the drift layer 14, the source well 18, and the JFET region 20 are n-type, while the body well 16 and the contact well 19 are p-type. A doping concentration of the substrate 12 may be between $1 \times 10^{18}$ cm$^{-3}$ and $1 \times 10^{21}$ cm$^{-3}$. A thickness of the substrate 12 may be between 10 μm and 360 μm. A doping concentration of the drift layer 14 may be between $1 \times 10^{17}$ cm$^{-3}$ and $5 \times 10^{13}$ cm$^{-3}$. The doping concentration of the drift layer 14 may be continuous along the thickness thereof (from top to bottom as shown in FIG. 1) or may vary according to a doping profile that changes along the thickness thereof. A thickness of the drift layer 14 may be between 2 μm and 200 μm. The doping concentration of the drift layer 14 may be dependent on the thickness of the drift layer 14. In particular, the doping concentration may be inversely proportional to the thickness of the drift layer 14. The body well 16 may have a doping concentration between $1 \times 10^{16}$ cm$^{-3}$ and $3 \times 10^{19}$ cm$^{-3}$. The body well 16 may have a thickness between 0.2 μm and 4 μm. The source well 18 may have a doping concentration between $1 \times 10^{18}$ cm$^{-3}$ and $1 \times 10^{21}$ cm$^{-3}$. The source well 18 may have a thickness between 0.1 μm and 2 μm. The JFET region 20 may have a doping concentration between $1 \times 10^{16}$ cm$^{-3}$ and $2 \times 10^{17}$ cm$^{-3}$. The JFET region 20 may have a thickness between 0.2 μm and 4 μm. While the transistor 10 is discussed above as an n-type device, the principles of the present disclosure apply equally to p-type devices. In one embodiment, the transistor 10 is a silicon carbide (SiC) device. However, the principles of the present disclosure apply equally to any material systems, and especially to wide bandgap material systems. For any of the doping concentration ranges or thickness ranges above, the present disclosure contemplates the use of any discrete point within the range or any sub-range within the broader range. For example, the present disclosure contemplates that the doping concentration of the drift layer 14 may be between $1 \times 10^{17}$ cm$^{-3}$ and $5 \times 10^{13}$ cm$^{-3}$, at or near $1 \times 10^{17}$ cm$^{-3}$, at or near $5 \times 10^{13}$ cm$^{-3}$, between $1 \times 10^{16}$ cm$^{-3}$ and $5 \times 10^{13}$ cm$^{-3}$, between $1 \times 10^{17}$ cm$^{-3}$ and $1 \times 10^{1s}$ cm$^{-3}$, or any other discrete point or sub-range within the broader exemplary range. The same applies to all ranges of doping concentrations and thickness ranges given herein. The contact well 19 may have a thickness between 0.1 μm and 2 μm. A doping concentration of the contact well 19 may be between $1 \times 10^{16}$ cm$^{-3}$ and $1 \times 10^{21}$ cm$^{-3}$.

In one embodiment, the transistor is a metal-oxide-semiconductor field-effect transistor (MOSFET). In such an embodiment, the gate insulator 26 may be an oxide layer. In another embodiment, the transistor is a metal-insulator-semiconductor field-effect transistor (MISFET).

The transistor 10 may be a power device capable of blocking high voltages and conducting high currents. In particular, the transistor 10 may have a breakdown voltage between 350V and 20 kV, depending on the application. Along this spectrum of breakdown voltages, an on-state resistance of the transistor 10 may be between 0.3 mΩ·cm$^2$ and 100 mΩ·cm$^2$. That is, for a breakdown voltage of 350V, the on-state resistance of the transistor 10 may be less than 0.3 mΩ·cm$^2$, while for a breakdown voltage of 20 kV, the on-state resistance of the transistor 10 may be less than 100 mΩ·cm$^2$. Other examples include an on-state resistance less than 90 mΩ·cm$^2$ for a breakdown voltage of 15 kV, an on-state resistance less than 70 mΩ·cm$^2$ for a breakdown voltage of 10 kV, and an on-state resistance less than 10 mΩ·cm$^2$ for a breakdown voltage of 3.3 kV. The on-state resistance may vary between these minimum and maximum values according to the breakdown voltage thereof.

As discussed above, transistors used for power switching applications should conduct current bidirectionally. While this may be achieved with an external diode coupled in anti-parallel between the source contact 22 and the drain contact 24 (anode to source, cathode to drain), the same result can also be achieved using a built-in body diode formed in the structure of the transistor 10. As shown in FIG. 1, a body diode 30 is formed between the source contact 22 and the drain contact 24 at the right of the device. The body diode 30 is a PiN diode including the source contact 22 as the anode, the body well 16, the contact well 19, the drift layer 14, the substrate 12, and the drain contact 24 as the cathode. Using the body diode 30 to allow bidirectional current conduction saves space by foregoing the need for an external diode. However, the body diode 30 may not be optimized for switching. In particular, the body diode 30 may suffer from a high degree of snappiness, which, as discussed in detail below, may increase switching times and switching losses.

Figure 2:
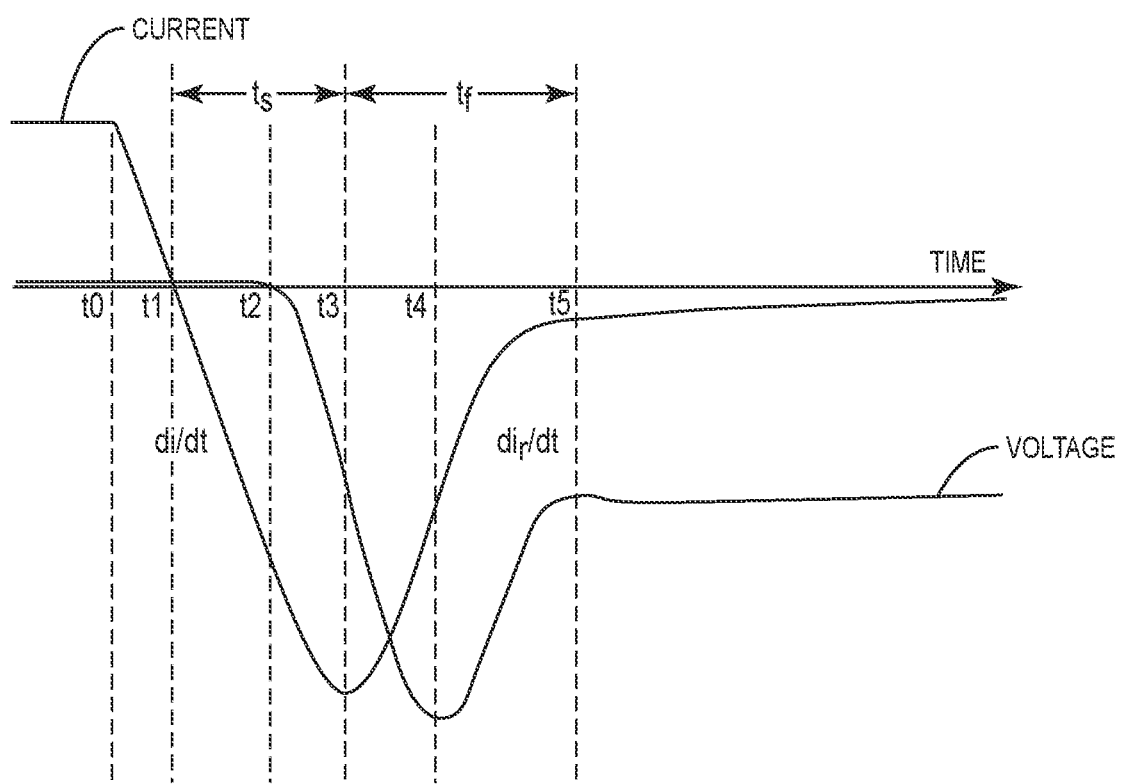
FIG. 2 is a graph illustrating the reverse recovery of a body diode in a transistor according to one embodiment of the present disclosure.

The snappiness of a diode characterizes the reverse recovery thereof. To illustrate, FIG. 2 is a graph showing a forward current and voltage across a diode when switching from forward conduction to reverse bias or blocking. Before time t0, the diode is forward biased and thus conducting current from anode to cathode. The voltage across the diode is thus around zero. During forward bias, excess minority carriers are injected into the drift region of a diode such that the drift region contains excess minority carriers. At time t0, the diode is switched from forward to reverse bias by changing the voltage supplied at the anode and cathode thereof. The current through the diode thus begins to decrease as excess minority carriers decay. Because of the current flow from the excess minority carriers, the voltage across the diode remains the same. At time t1, the current through the diode switches from a positive current to a negative current. The voltage across the diode continues to remain the same. As the stored excess minority carriers in the drift region begin to decrease, a resistance of the region increases. Accordingly, at time t2 the voltage across the diode begins to decrease, while the current continues to decrease. The depletion region begins to form at this time. At time t3, the reverse current through the diode reaches its maximum value when very few excess minority carriers are left in the drift region. At time t4, the negative voltage across the diode reaches its peak value. The current through the diode and the voltage across it continue to increase until time t5 when they stabilize at zero and the reverse voltage, respectively.

During the reverse recovery process, a capacitance across the diode is defined by a diffusion capacitance and a depletion capacitance, which are due to the diffusion region and depletion region therein, respectively. As the depletion region grows, the values of the diffusion capacitance and depletion capacitance change. In cases wherein the depletion region punches through the diode such that the diffusion region no longer exists, the diffusion capacitance suddenly goes to zero, causing a high change in the overall capacitance of the diode, which can lead to ringing and distortion.

The time between when the current through the diode passes through zero (ti) and reaches its negative peak value (t3) is shown as $t_s$. The time between when the current through the diode reaches its negative peak value (t3) and when it recovers to $0.2 \cdot I_{RRM}$ (t5) is shown as $t_f$. The ratio between $t_f$ and $t_s$ ($t_f/t_s$) is defined herein as a softness factor $S_1$ of the diode. The softness factor is inversely correlated with snappiness of the diode. Accordingly, a higher softness factor is desirable. A secondary softness factor $S_2$ is defined herein as $$\left| \frac{\left.\frac{di}{dt}\right|_{i=0}}{\left(\frac{di_r}{dt}\right)_{max}} \right|,$$

where a higher value of the secondary softness factor is desirable. Yet another way to quantify the snappiness of softness of a diode is by looking at the area between x-axis (zero current) and the negative reverse recovery current curve. It is generally desirable to minimize this area. where a higher value of the secondary softness factor is desirable. Yet another way to quantify the snappiness of softness of a diode is by looking at the area between x-axis (zero current) and the negative reverse recovery current curve. It is generally desirable to minimize this area.

Conventionally, those skilled in the art will design a transistor based on several desired characteristics of the transistor itself, such as breakdown voltage and on-state resistance. Put another way, those skilled in the art have generally not designed transistors with the performance of the body diode in mind. The inventors of the present disclosure discovered that one or more characteristics of the body diode of a transistor can be improved significantly with small or minimal impacts on the performance of the transistor. In particular, the snappiness of the body diode in a transistor can be significantly reduced while maintaining the performance of the transistor.

To improve the snappiness of the body diode 30 within the transistor 10, several adjustments are made. First, the transistor 10 is designed such that the body diode 30 is a non-punch through diode. As discussed herein, a non-punch through diode is defined as a diode wherein at the breakdown voltage of the diode, the depletion region formed in the drift layer thereof does not penetrate into the substrate or neighboring n+ layer. In the case of the body diode 30, this means that at the breakdown voltage thereof, the depletion region will remain within the drift layer 14 and not penetrate into the substrate 12. The body diode 30 may be designed to be non-punch through by changing a doping concentration and/or a thickness of the drift layer 14 compared to conventional designs wherein these parameters are optimized for the desired breakdown voltage and on-state resistance of the transistor 10. In particular, the thickness and the doping concentration of the drift layer 14 may be increased compared to conventional designs in order to ensure that the depletion region of the body diode 30 remains within the drift layer 14 during reverse bias. Accordingly, for a given breakdown voltage of the transistor 10, the drift layer 14 will be thicker and more highly doped compared to its conventional counterparts.

To provide a non-punch through diode, the following equations may be used to determine a thickness and doping concentration of the drift layer 14. Equation (1) illustrates a relationship between breakdown voltage $BV_{diode}$ and doping concentration $N_D$. Equation (2) illustrates a relationship between a maximum width of a depletion region $W_{d,max}$ and the doping concentration $N_D$.

$$BV_{diode} = 3.0 \times 10^{15} N_D^{-\frac{3}{4}} \quad (1)$$

$$W_{d,max} = 1.82 \times 10^{11} N_D^{-\frac{7}{8}} \quad (2)$$

For a given breakdown voltage, the doping concentration of the drift layer 14 can thus be chosen along with a thickness of the drift layer 14 so that the maximum width of the depletion region $W_{d,max}$ does not exceed the thickness of the drift layer 14.

Figure 3A:
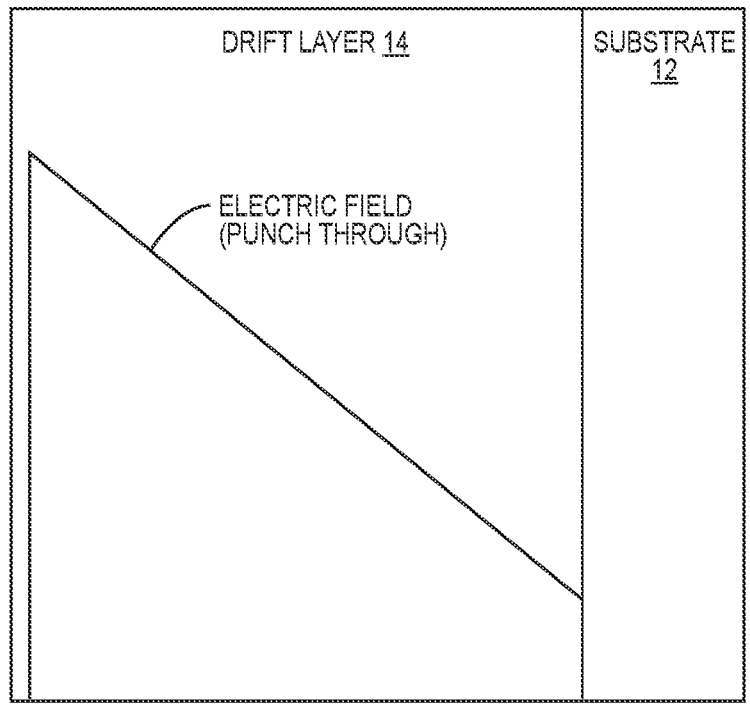
FIG. 3A illustrates an electric field within a drift layer for a punch through diode according to one embodiment of the present disclosure.
Figure 3B:
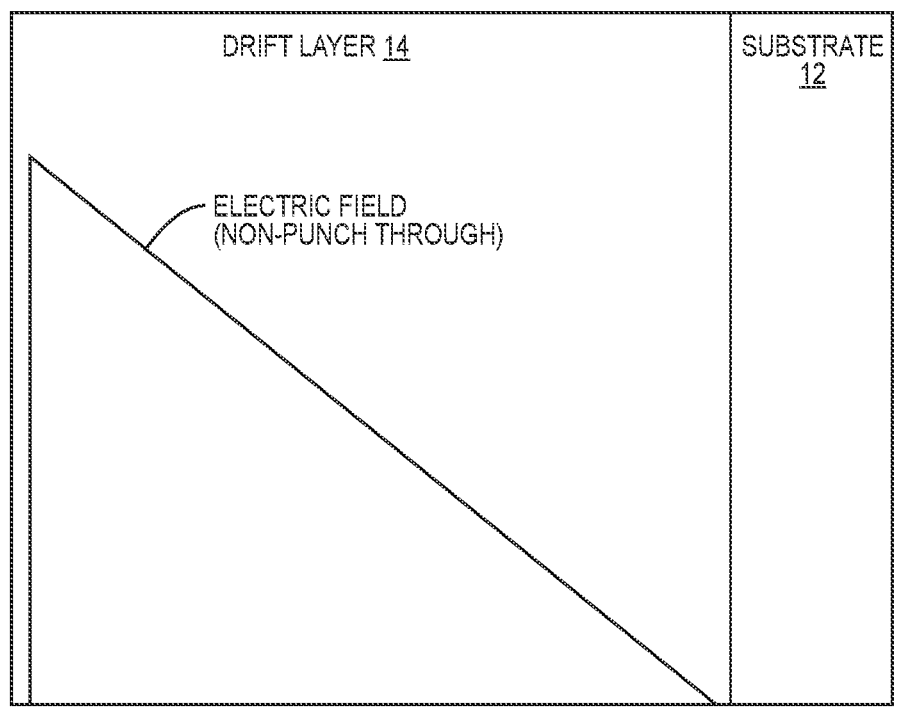
FIG. 3B illustrates an electric field within a drift layer for a non-punch through diode according to one embodiment of the present disclosure.

FIGS. 3A and 3B illustrate an electric field within the drift layer 14 for a punch through diode and a non-punch through diode, respectively. In particular, FIG. 3A shows a line illustrating the electric field within the drift layer 14 of a punch through diode as described herein and FIG. 3B shows a line illustrating the electric field within the drift layer 14 of a non-punch through diode. As shown, for the non-punch through diode the electric field is reduced to zero before reaching the interface between the drift layer 14 and the substrate 12. For the punch through diode the electric field remains at a significant level at the interface between the drift layer 14 and the substrate 12 and thus "punches through" the drift layer 14. As discussed herein, the transistor 10 can be designed to provide the body diode 30 as a non-punch through diode, which may improve the snappiness of the body diode 30. As discussed herein, one way to achieve the non-punch through body diode 30 is to increase the thickness of the drift layer 14, which is why the drift layer 14 in FIG. 3B is thicker than the one in FIG. 3A. However, other design considerations apply as well.

Applying conventional design rules to the transistor 10 would dictate choosing a thickness and doping concentration of the drift layer 14 in order to minimize on-state resistance for a given breakdown voltage. While this may lead to optimization of these characteristics, it may result in the body diode 30 being a punch through diode. The inventors of the present disclosure discovered that the thickness and doping concentration of the drift layer 14 can be chosen such that the body diode 30 is a non-punch through diode while also maintaining desirable, but perhaps slightly higher, on-state resistance of the transistor 10 at a given breakdown voltage. Providing the body diode 30 as a non-punch through diode allows carriers to remain longer in the drift layer 14 since they are not quickly swept out at the interface with the substrate 12 due to a reduced electric field in this area. Further, providing the body diode 30 as a non-punch through diode reduces ringing and distortion that would otherwise occur due to large changes in the diffusion capacitance of the body diode 30 during reverse recovery by preventing the diffusion capacitance from suddenly going to zero.

Figure 4:
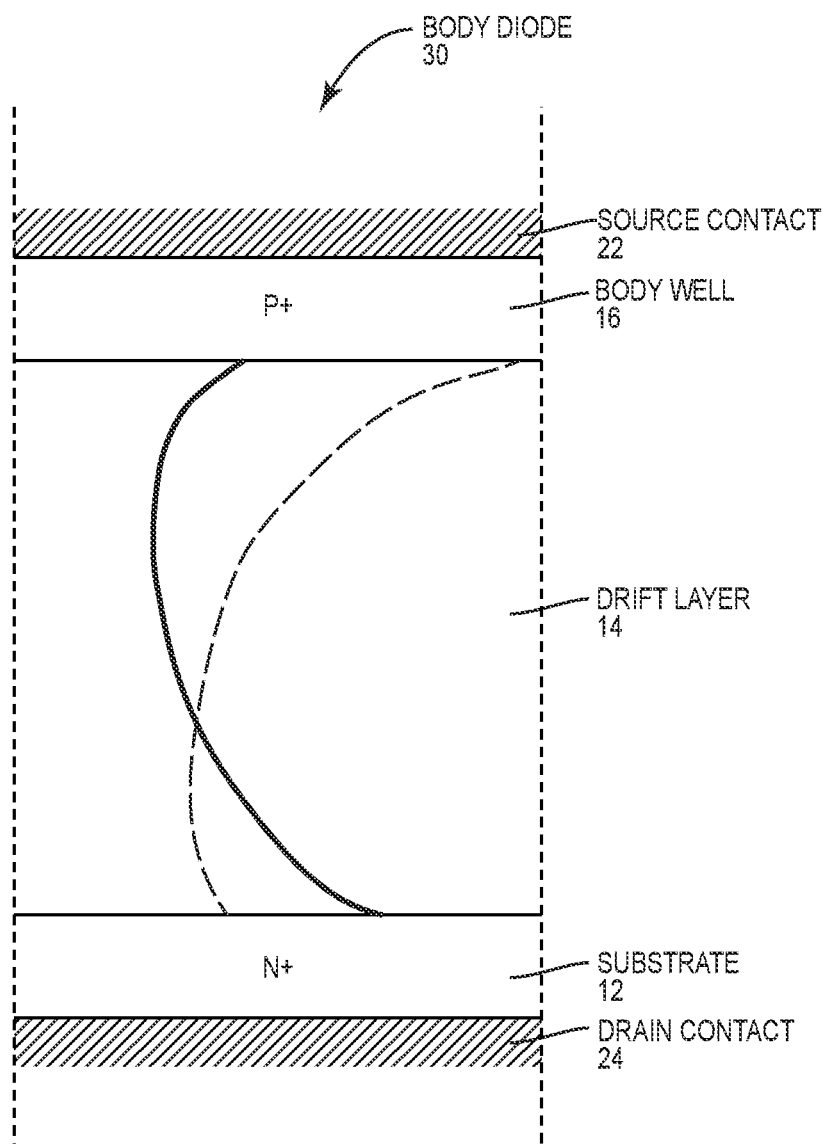
FIG. 4 is a cross-sectional view of a body diode of a transistor according to one embodiment of the present disclosure.

In addition to or independently from providing the body diode 30 as a non-punch through diode, a distribution profile of minority carriers within the body diode 30 during forward bias is also changed. FIG. 4 thus shows a cross-section of the body diode 30 isolated from the transistor 10. A dashed line shows a distribution of minority carriers during forward bias if the body diode 30 is provided in a conventional manner without the improvements discussed herein. A solid line shows a distribution of minority carriers during forward bias for the body diode 30 when the improvements discussed herein are provided. As shown, without the improvements discussed herein a concentration of minority carriers is higher at an interface between the body well 16 and the drift layer 14 than at an interface between the drift layer 14 and the substrate 12. This may cause reduced performance during reverse recovery of the diode. In particular, as the body diode 30 enters reverse bias, if there are a high concentration of minority carriers at the interface between the body well 16 and the drift layer 14, as illustrated by the dashed line, it will take longer to sweep out these minority carriers and begin forming the depletion region. This will prolong is as shown in FIG. 2, thereby increasing snappiness (decreasing the softness factor $t_f/t_s$) and degrading performance. Further, if there is a relatively low concentration of minority carriers at the interface between the drift layer 14 and the substrate 12, again as illustrated by the dashed line, as the depletion region grows these carriers may be swept out of the drift layer 14 thus causing the depletion region to punch through into the substrate 12. As discussed above, this will also degrade performance due to the sudden disappearance of the diffusion capacitance within the body diode 30. Further, increasing the concentration of minority carriers near the interface between the drift layer 14 and the substrate 12 prolongs $t_f$ as shown in FIG. 2, thereby decreasing snappiness (increasing the softness factor $t_f/t_s$). Accordingly, it is desirable to have a lower concentration of minority carriers at the interface between the body well 16 and the drift layer 14 and a higher concentration of minority carriers at the interface between the drift layer 14 and the substrate 12 as illustrated by the solid line. In general, it is desirable to have a positive slope (on average) of minority carrier concentration in the drift layer 14 between the body well 16 and the substrate 12.

There are several ways to achieve the desired minority carrier profile discussed above. In one embodiment, a carrier lifetime of the drift layer 14 is enhanced in order to increase the concentration of minority carriers at and near the interface between the drift layer 14 and the substrate 12. In SiC, carbon vacancies may decrease carrier lifetimes by forming recombination centers for minority carriers. To decrease the carbon vacancies, a high temperature oxidation of the drift layer 14 is performed as discussed in detail below, thereby increasing carrier lifetime throughout the drift layer 14. In various embodiments, the minority carrier lifetime in the drift layer 14 may be intentionally raised to be between 0.5 µs and 20 µs. Notably, the present disclosure contemplates the use of any discrete value within the exemplary range of minority carrier lifetimes given above, or any sub-range within the broader range. For example, in various embodiments, the minority carrier lifetime of the drift layer 14 may be between 1 µs and 20 µs, 10 µs and 20 µs, between 1 µs and 5 µs, between 5 µs and 10 µs, between 15 µs and 20 µs, between 3 µs and 10 µs, or any other sub-range or discrete point within the broader exemplary range. Those skilled in the art will appreciate that $Z_{1/2}$ trap density is inversely correlated with carrier lifetime in SiC. Accordingly, increasing the carrier lifetime in the drift layer 14 may involve reducing a $Z_{1/2}$ trap density. In various embodiments, the $Z_{1/2}$ trap density of the drift layer 14 may be reduced to be below $5 \times 10^{13}$ cm$^{-3}$, below $1 \times 10^{13}$ cm$^{-3}$, below $5 \times 10^{12}$ cm$^{-3}$, below $1 \times 10^{12}$ cm$^{-3}$, and as low as $1 \times 10^{10}$ cm$^{-3}$.

In addition to improvements in carrier lifetime in the drift layer 14, a reduction in minority carriers at the interface between the body well 16 and the drift layer 14 is also desirable. This can be achieved by reducing a doping concentration of the body well 16 such that less minority carriers are injected from the body well 16 into the drift layer 14 during forward bias. In various embodiments, a doping concentration of the body well 16 near the interface between the body well 16 and the drift layer 14 is between $1 \times 10^{16}$ cm$^{-3}$ and $3 \times 10^{19}$ cm$^{-3}$, which may be anywhere from about five to fifteen times less than conventional doping concentrations. More specifically, a doping concentration of the body well 16 within 0.2 µm of the interface between the body well 16 and the drift layer 14 may be between $1 \times 10^{16}$ cm$^{-3}$ and $3 \times 10^{19}$ cm$^{-3}$. Notably, the present disclosure contemplates that the doping concentration of the body well 16 may be any discrete value within the given exemplary range of doping concentrations, or any sub-range within the exemplary range.

Figure 5A:
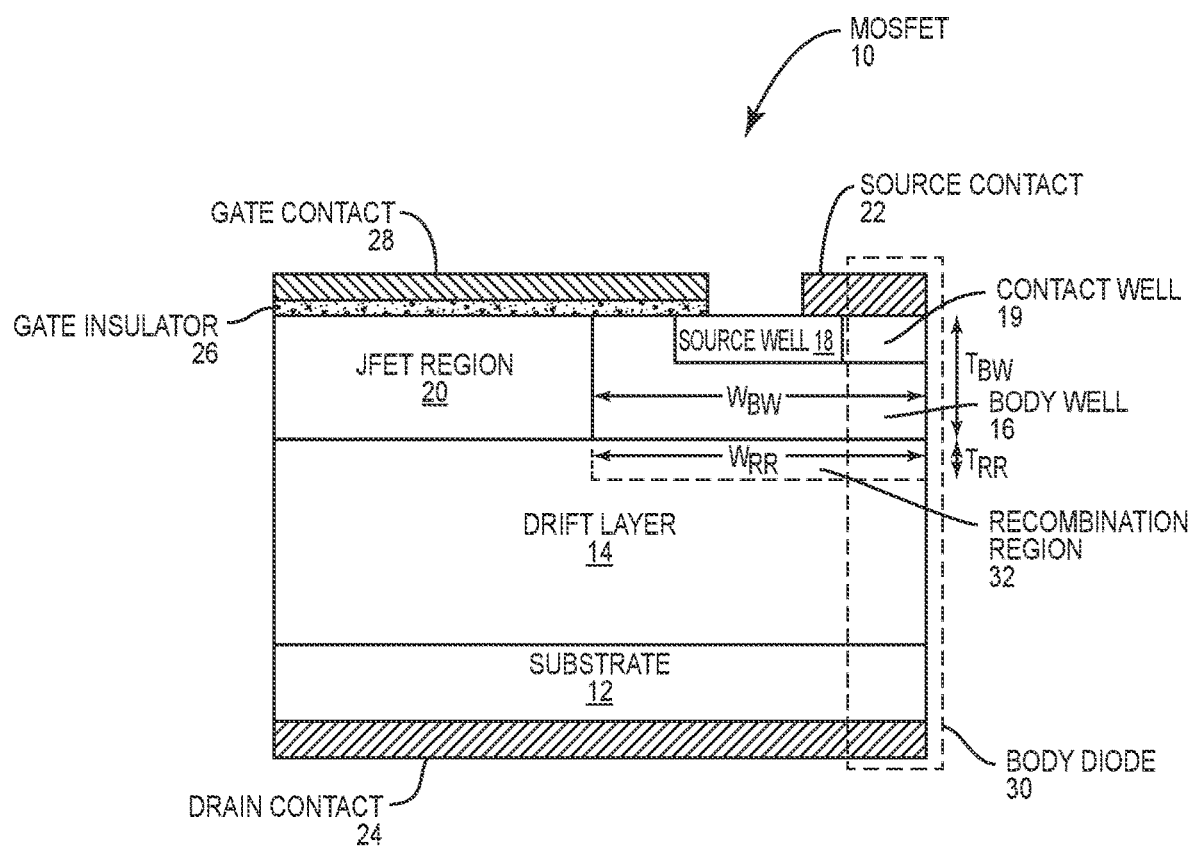
FIGS. 5A-5E illustrate a cross-sectional view of a transistor according to various embodiments of the present disclosure.

In addition to or separately from reducing the doping concentration of the body well 16, a recombination region 32 may be provided in the drift region 14 at or near the interface between the body well 16 and the drift layer 14, as shown in FIG. 5A. The recombination region 32 is a region including a higher density of minority carrier recombination centers than the surrounding drift layer 14. This may be accomplished by intentionally damaging the recombination region 32 via an implantation process, or by doping the recombination region 32. In one embodiment, the recombination region is implanted with argon in order to increase the density of minority carrier recombination centers therein. However, other implants such as hydrogen and helium may also be used in some embodiments. The density of minority carriers in the recombination region 32 may be between five to ten times greater than in the drift layer 14. In various embodiments, a density of minority carrier recombination centers in the recombination region 32 is between $1 \times 10^{13}$ cm$^{-3}$ and $1 \times 10^{18}$ cm$^{-3}$. Notably, the density of minority carrier recombination centers in the recombination region 32 may be any discrete point within this range, or any subrange within this range. For example, the density of minority carrier recombination centers in the recombination region 32 may be between $1 \times 10^{14}$ cm$^{-3}$ and $1 \times 10^{18}$ cm$^{-3}$, between $1 \times 10^{15}$ cm$^{-3}$ and $1 \times 10^{18}$ cm$^{-3}$, between $1 \times 10^{16}$ cm$^{-3}$ and $1 \times 10^{18}$ cm$^{-3}$, between $1 \times 10^{17}$ cm$^{-3}$ and $1 \times 10^{18}$ cm$^{-3}$, between $1 \times 10^{14}$ cm$^{-3}$ and $1 \times 10^{17}$ cm$^{-3}$, between $1 \times 10^{14}$ cm$^{-3}$ and $1 \times 10^{16}$ cm$^{-3}$, between $1 \times 10^{14}$ cm$^{-3}$ and $1 \times 10^{15}$ cm$^{-3}$, between $1 \times 10^{15}$ cm$^{-3}$ and $1 \times 10^{17}$ cm$^{-3}$, and between $1 \times 10^{17}$ cm$^{-3}$ and $1 \times 10^{18}$ cm$^{-3}$, or at any discrete point within any of these ranges. While the recombination region 32 is shown as a localized region in the body diode 30 at or near the interface of the body well 16 and the drift layer 14, the recombination region 32 may be a blanket region over the entirety of the transistor 10 or may include several regions that are separated from one another. The density of minority carrier recombination centers in the recombination region 32 may be between 6 and 7 times greater than the drift layer 14, between 7 and 8 times greater than the drift layer 14, between 8 and 9 times greater than the drift layer 14, between 5 and 9 times greater than the drift layer 14, between 6 and 9 times greater than the drift layer, or at any other sub-range or discrete point within the broader exemplary range.

A thickness of the body well 16 is illustrated as $T_{bw}$. In various embodiments, $T_{bw}$ may be between 0.1 µm and 2.0 µm. $T_{bw}$ may be any subrange in the larger range of 0.1 µm to 2.0 µm. For example, $T_{bw}$ may be between 0.25 µm and 0.5 µm, between 0.25 µm and 0.75 µm, between 0.25 µm and 1.0 µm, between 0.25 µm and 1.25 µm, between 0.25 µm and 1.5 µm, between 0.25 µm and 1.75 µm, between 0.5 µm and 0.75 µm, between 0.5 µm and 1.0 µm, between 0.5 µm and 1.25 µm, between 0.5 µm and 1.5 µm, between 0.5 µm and 1.75 µm, between 0.5 µm and 2.0 µm, between 0.75 µm and 1.0 µm, between 0.75 µm and 1.25 µm, between 0.75 µm and 1.5 µm, between 0.75 µm and 1.75 µm, between 0.75 µm and 2.0 µm, between 1.0 µm and 1.25 µm, between 1.0 µm and 1.5 µm, between 1.0 µm and 1.75 µm, between 1.0 µm and 2.0 µm, between 1.25 µm and 1.5 µm, between 1.25 µm and 1.75 µm, between 1.25 µm and 2.0 µm, between 1.5 µm and 1.75 µm, between 1.5 µm and 2.0 µm, and between 1.75 µm and 2.0 µm. A width of the body well 16 is illustrated as $W_{bw}$. In various embodiments, a width of the body well 16 may be between 1 µm and 10 µm. $W_{bw}$ may be any subrange in the larger range of 1 µm to 10 µm. For example, $W_{bw}$ may be between 1 µm and 2 µm, 1 µm and 3 µm, 1 µm and 4 µm, 1 µm and 5 µm, 1 µm and 6 µm, 1 µm and 7 µm, 1 µm and 8 µm, 1 µm and 9 µm, 1 µm and 10 µm, 2 µm and 3 µm, 2 µm and 4 µm, 2 µm and 5 µm, 2 µm and 6 µm, 2 µm and 7 µm, 2 µm and 8 µm, 2 µm and 9 µm, 2 µm and 10 µm, 3 µm and 4 µm, 3 µm and 5 µm, 3 µm and 6 µm, 3 µm and 7 µm, 3 µm and 8 µm, 3 µm and 9 µm, 3 µm and 10 µm, 4 µm and 5 µm, 4 µm and 6 µm, 4 µm and 7 µm, 4 µm and 8 µm, 4 µm and 9 µm, 4 µm and 10 µm, 5 µm and 6 µm, 5 µm and 7 µm, 5 µm and 8 µm, 5 µm and 9 µm, 5 µm and 10 µm, 6 µm and 7 µm, 6 µm and 8 µm, 7 µm and 9 µm, 7 µm and 10 µm, 8 µm and 9 µm, 8 µm and 10 µm, and 9 µm and 10 µm. A doping concentration of the body well 16 may be between $1 \times 10^{16}$ cm$^{-3}$ and $3 \times 10^{19}$ cm$^{-3}$, or within any subrange of this larger range. In various embodiments, the doping concentration of the body well 16 may be between $5 \times 10^{16}$ cm$^{-3}$ and $3 \times 10^{19}$ cm$^{-3}$, between $1 \times 10^{17}$ cm$^{-3}$ and $3 \times 10^{19}$ cm$^{-3}$, between $5 \times 10^{17}$ cm$^{-3}$ and $3 \times 10^{19}$ cm$^{-3}$, between $1 \times 10^{18}$ cm$^{-3}$ and $3 \times 10^{19}$ cm$^{-3}$, between $5 \times 10^{18}$ cm$^{-3}$ and $3 \times 10^{19}$ cm$^{-3}$, between $5 \times 10^{17}$ cm$^{-3}$, between $1 \times 10^{19}$ cm$^{-3}$ and $1 \times 10^{17}$ cm$^{-3}$, between $1 \times 10^{16}$ cm$^{-3}$ and $5 \times 10^{16}$ cm$^{-3}$, between $5 \times 10^{16}$ cm$^{-3}$ and $1 \times 10^{19}$ cm$^{-3}$, between $1 \times 10^{17}$ cm$^{-3}$ and $5 \times 10^{18}$ cm$^{-3}$, and between $5 \times 10^{17}$ and $1 \times 10^{18}$ cm$^{-3}$. In some embodiments, a doping profile of the body well 16 remains relatively constant along the thickness $T_{bw}$ thereof. In other embodiments, a doping concentration of the body well 16 varies along the thickness $T_{bw}$ thereof. For example, the doping profile of the body well may be linear (increasing from top to bottom or bottom to top), triangular (increasing and then decreasing from top to bottom), graded (increasing or decreasing along a curve from top to bottom), or any other doping profile. In one embodiment, a doping profile of the body well 16 decreases in proportion to a distance from the surface of the drift layer 14 such that injection of minority carriers from the body well 16 is reduced at the junction between the body well 16 and the drift layer 14.

A thickness of the recombination region 32 is illustrated as $T_{rr}$. In various embodiments, $T_{rr}$ may be between 1 nm up to the thickness of the drift layer 14, which may be as thick as 200 µm. $T_{rr}$ may be between any subrange in the larger range of 1 nm and 200 µm. For example, $T_{rr}$ may be between 1 nm and 100 nm, between 1 nm and 1 µm, between 1 nm and 5 µm, between 1 nm and 10 µm, between 10 nm and 1 µm, between 10 nm and 5 µm, between 10 nm and 10 µm, between 100 nm and 1 µm, between 100 nm and 5 µm, between 100 nm and 10 µm, between 1 µm and 5 µm, between 1 µm and 10 µm, between 5 µm and 10 µm, between 5 µm and 50 µm, between 10 µm and 50 µm, between 10 µm and 100 µm, or any other subrange within the larger range of 1 nm to 200 µm. A width $W_{rr}$ of the recombination region 32 may be between 0.25 µm and as large as the width of the active area of the transistor 10, which may be up to 15 mm. $W_{rr}$ may be any subrange in the larger range of 0.25 µm to 15 mm. For example, $W_{rr}$ may be between 0.25 µm and 0.5 µm, between 0.25 µm and 0.75 µm, between 0.25 µm and 1.0 µm, between 0.25 µm and 1.25 µm, between 0.25 µm and 1.5 µm, between 0.25 µm and 1.75 µm, between 0.25 µm and 2.0 µm, between 0.25 µm and 2.5 µm, between 0.25 µm and 2.5 µm, between 0.5 µm and 1.0 µm, between 0.5 µm and 2.0 µm, between 1.0 µm and 2.0 µm, between 1.0 µm and 5.0 µm, between 2.0 µm and 5.0 µm, between 2.0 µm and 10 µm, between 5.0 µm and 10 µm, or any other subrange of the larger range. In some embodiments, $W_{rr}$ may at least as wide as a width of the contact region 19. As discussed above, the recombination region 32 may be provided in a localized area below the body well 16 or a portion thereof, for example, in the area shown as the body diode 30, or may extend across a larger portion of the drift layer 14 such that it is under all or a portion of the JFET region 20 and/or any other regions that are not shown, such as the entire active area. In some embodiments, the density of minority carrier recombination centers in the recombination region 32 may remain relatively constant along the thickness $T_{rr}$ thereof. In other embodiments, a density of minority carrier recombination centers in the recombination region 32 varies along the thickness $T_{rr}$ thereof in a desired profile, such as linear, triangular, graded, or the like.

Figure 5B:
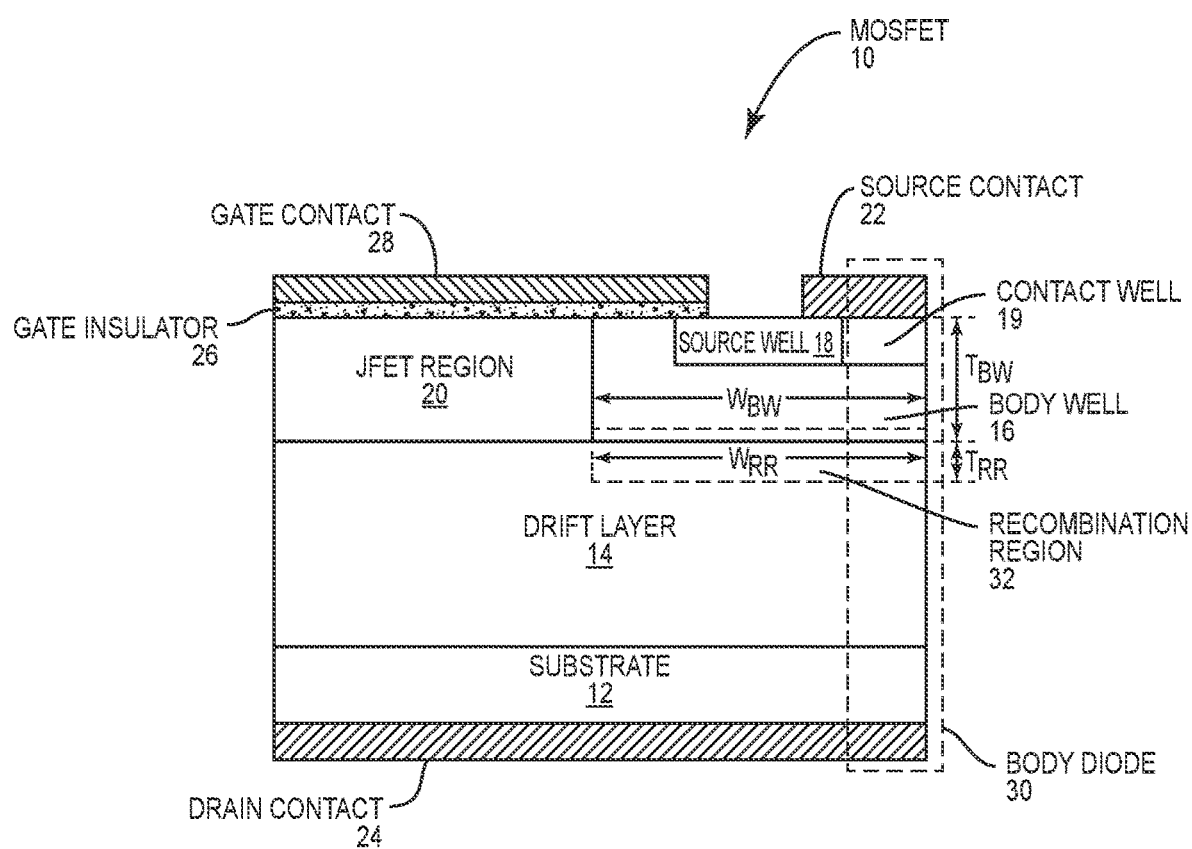
Figure 5C:
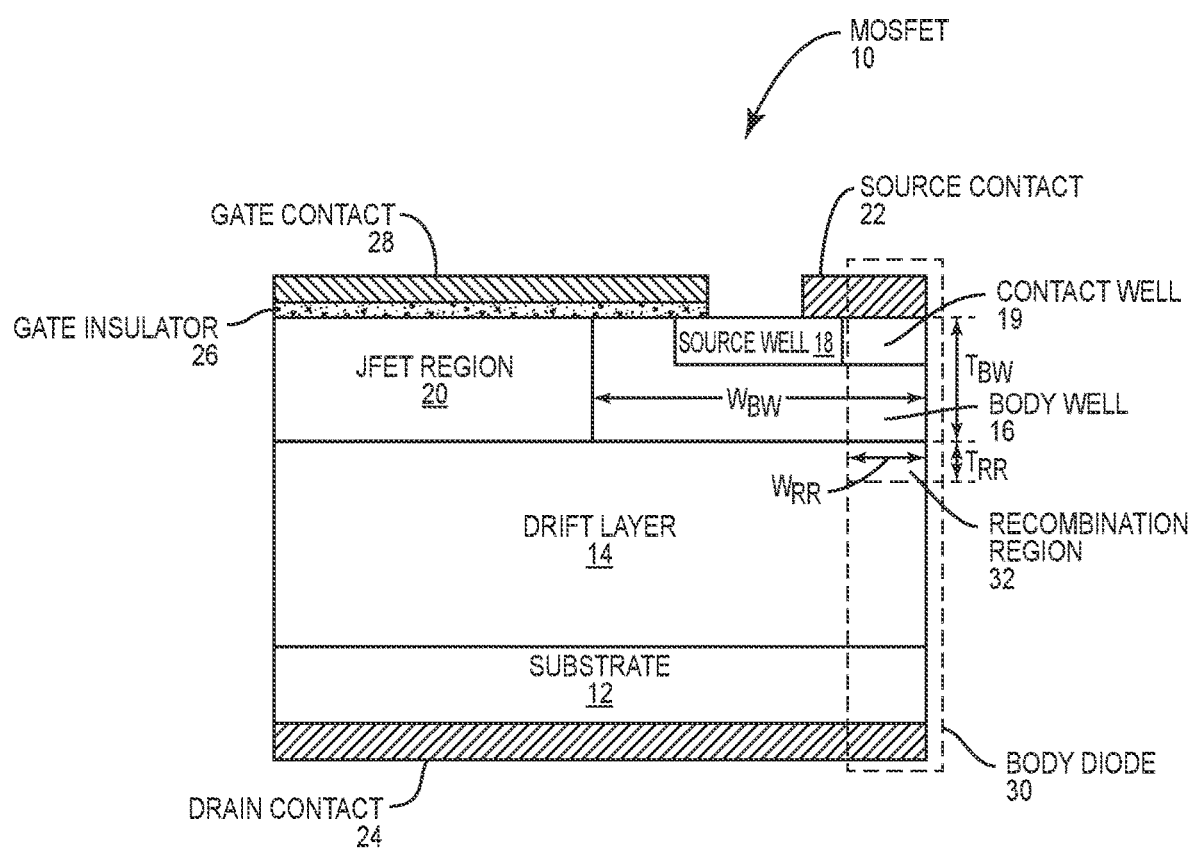
Figure 5D:
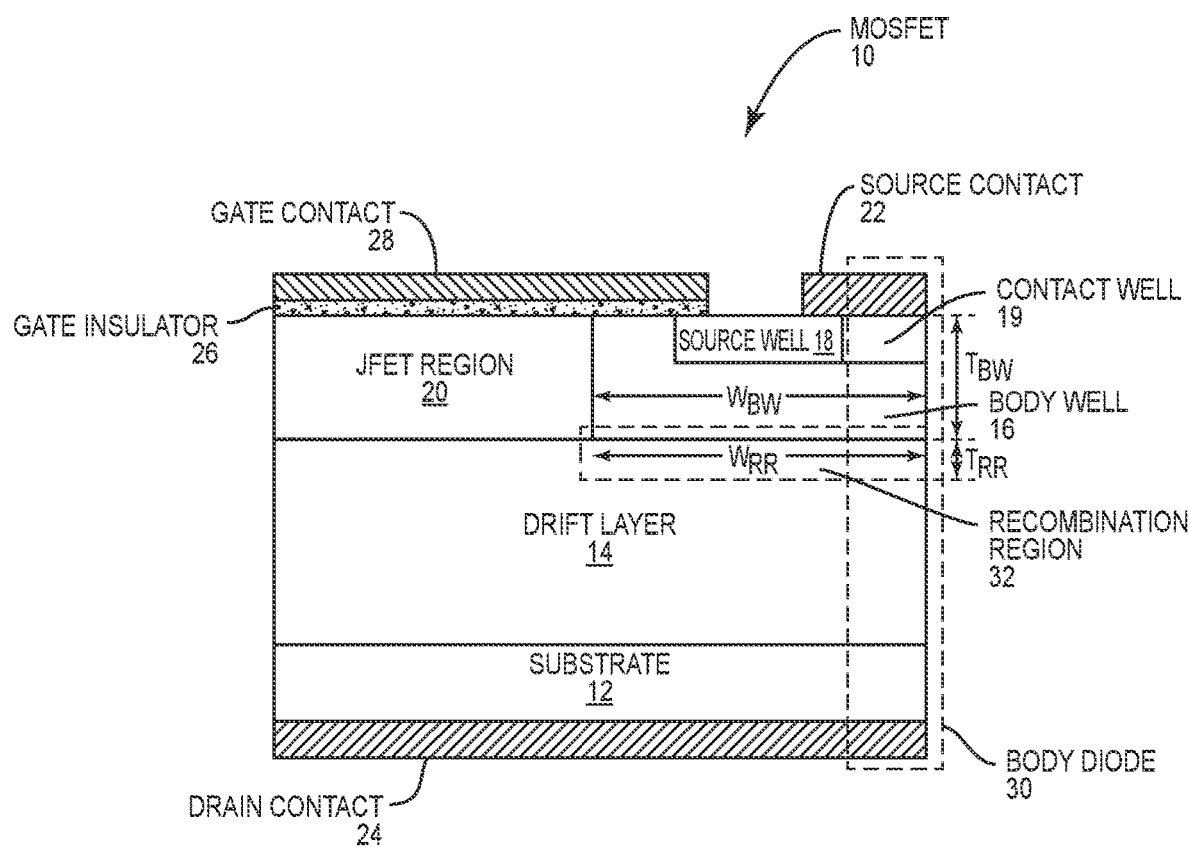
Figure 5E:
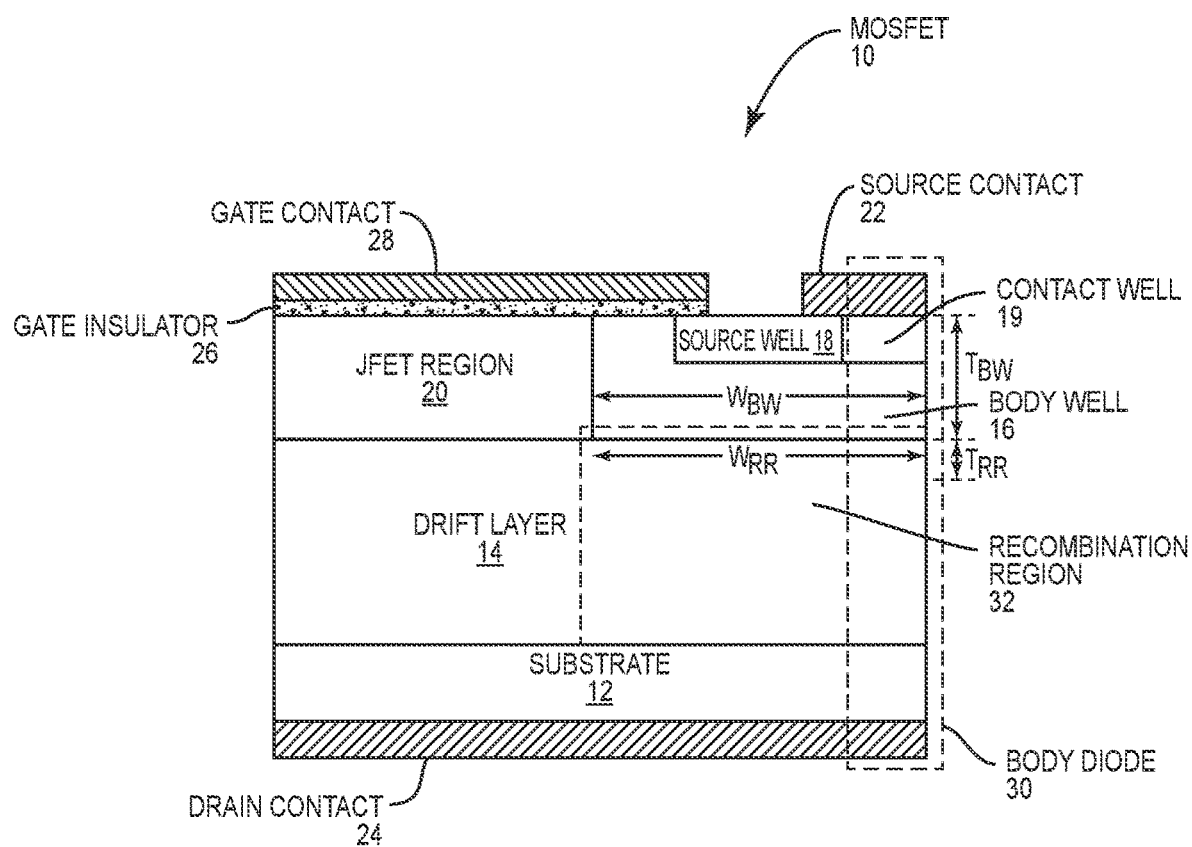

The recombination region 32 can be located directly below the body well 16 in the drift layer 14 or can overlap all or a portion of the thickness of the body well 16 as shown in FIG. 5B. Further, the recombination region 32 can extend along only a portion of the width of the body well 16 as shown in FIG. 5C. In some embodiments, the recombination region 32 may encapsulate the bottom corner or the entirety of the body well 16 as shown in FIG. 5D. Finally, the recombination region 32 may be provided along an entire thickness of the drift layer 14 in any portion of the drift layer below the body well 16 as shown in FIG. 5E. In short, the recombination region 32 may be provided in all or a portion of the area near the body well 16 in order to create a desired minority carrier profile and thus improve the softness of body diode 30. The recombination region 32 may reduce minority carrier injection into the drift layer 14 by providing recombination centers for the minority carriers below the body well 16. This may increase carrier lifetime in the drift layer 14 thus further improving the softness of the body diode 30.

Figure 6:
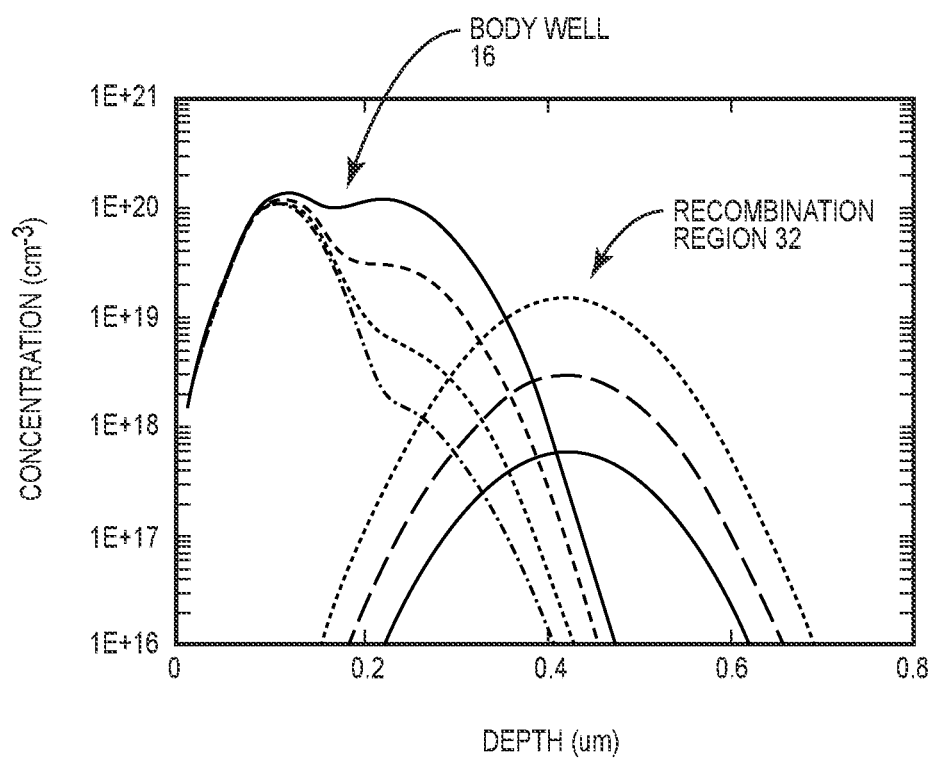
FIG. 6 is a graph illustrating doping profiles for a number of implants in a transistor according to one embodiment of the present disclosure.

FIG. 6 is a graph illustrating potential implantation profiles for the body well 16 and the recombination region 32 according to various embodiments of the present disclosure. On the left side of the graph, four different doping profiles for the body well 16 are shown. A first solid line represents the conventional doping profile for the body well 16. As discussed above, this may result in an undesirably high level of minority carrier injection into the drift layer 14. Accordingly, the three lines below this first solid line, shown as a dashed line, a dotted line, and a dotted and dashed line, illustrate doping profiles for the body well 16 according to various embodiments of the present disclosure. As shown, each one of the doping profiles provides a peak at roughly the same level, but reduces the doping concentration near the bottom of the body well 16, which is where the interface between the body well 16 and the drift layer 14 is located. In the middle of the graph, three lines are shown illustrating various doping profiles for the recombination region 32. In particular, a solid line shows the recombination region 32 resulting from an implantation dose of argon at $1 \times 10^{13}$ cm$^{-3}$, a dashed line shows the recombination region 32 resulting from an implantation dose of argon at $5 \times 10^{13}$ cm$^{-3}$, and a dotted line shows the recombination region 32 resulting from an implantation does of argon at $2.5 \times 10^{14}$ cm$^{-3}$. As shown, the recombination region 32 may overlap with the body well 16, peaking at the interface between the body well 16 and the drift layer 14. Notably, the doping profiles for the body well 16 and the recombination region 32 shown in FIG. 6 are merely illustrative. Those skilled in the art will readily appreciate that there are myriad ways to provide the body well 16 and the recombination region 32 to accomplish the objectives discussed above, all of which are contemplated herein.

Providing the body diode 30 as a non-punch through diode and/or redistributing the minority carriers in the drift layer 14 as discussed above may enable the body diode 30 to provide a softness factor $S_1$ greater than 0.5. In various embodiments, the improvements to the body diode 30 discussed above, either alone or in combination, may enable the body diode 30 to provide a softness factor $S_1$ greater than 0.6, greater than 0.7, greater than 0.8, greater than 0.9, greater than 1.0, greater than 1.1, greater than 1.2, greater than 1.3, greater than 1.4, greater than 1.5, greater than 2.0, greater than 2.5, greater than 3.0, greater than 3.5, greater than 4.0, greater than 4.5, greater than 5.0, greater than 5.5, greater than 6.0, greater than 6.5, greater than 7.0, greater than 7.5, greater than 8.0, greater than 8.5, greater than 9.0, greater than 9.5, and up to 10. More generally, the present disclosure contemplates a softness factor $S_1$ of the body diode 30 at any discrete point between 0.5 and 10, or any subrange within 0.5 and 10.

Similarly, the improvements to the body diode 30 may provide a secondary softness $S_2$ factor greater than 0.5. In various embodiments, the improvements to the body diode 30 discussed above, either alone or in combination, may enable the body diode 30 to provide a secondary softness factor $S_2$ greater than 0.6, greater than 0.7, greater than 0.8, greater than 0.9, greater than 1.0, greater than 1.1, greater than 1.2, greater than 1.3, greater than 1.4, greater than 1.5, greater than 2.0, greater than 2.5, greater than 3.0, greater than 3.5, greater than 4.0, greater than 4.5, greater than 5.0, greater than 5.5, greater than 6.0, greater than 6.5, greater than 7.0, greater than 7.5, greater than 8.0, greater than 8.5, greater than 9.0, greater than 9.5, and up to 10. More generally, the present disclosure contemplates a secondary softness factor $S_2$ of the body diode 30 at any discrete point between 0.5 and 10, or any subrange within 0.5 and 10.

Figure 7:
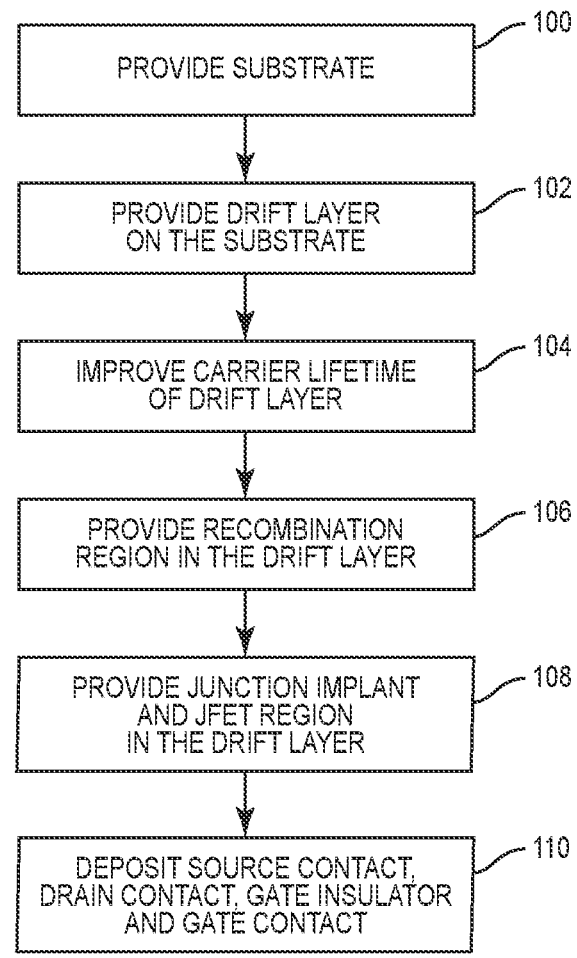
FIG. 7 is a flow diagram illustrating a method for manufacturing a transistor according to one embodiment of the present disclosure.

FIG. 7 is a flow diagram illustrating a method for manufacturing a transistor according to one embodiment of the present disclosure. First, a substrate is provided (step 100). A drift layer is provided on the substrate (step 102). As discussed above, a thickness and doping concentration of the drift layer is selected in order to make a body diode in the finished transistor a non-punch through diode. In particular, a thickness of the drift layer and/or doping concentration of the drift layer are increased compared to conventional designs for a given breakdown voltage in order to provide the body diode as a non-punch through diode. A carrier lifetime improvement process is performed on the drift layer (step 104). In one embodiment, the carrier lifetime improvement process is a high temperature oxidation of the drift layer. In particular, the drift layer may be oxidized at a temperature between 1300° C. and 1500° C. for a period of time between 30 minutes and 5 hours in order to decrease carbon vacancies that may otherwise reduce minority carrier lifetime in the drift layer. Notably, the present disclosure is not limited to any particular carrier lifetime improvement process, but rather contemplates any currently existing methods for improving carrier lifetime.

A recombination region is provided in the drift layer (step 106). In one embodiment, providing the recombination region comprises damaging a region of the drift layer via ion implantation. In another embodiment, providing the recombination region comprises implanting argon into a region of the drift layer. The recombination region may be provided as a blanket region or localized to certain regions within the drift layer. In general, the recombination region is provided so that it is localized to a particular depth in the drift layer in order to provide increased recombination centers near an interface between a body well and the drift layer. A junction implant including a body well and a source well is provided in the surface of the drift layer opposite the substrate (step 108). Notably, the body well is provided with a doping concentration near the interface between the body well and the drift layer that is less than conventional design processes dictate. The source well is provided within the body well at a surface of the drift layer. The contact well is also provided within the body well adjacent to the source well. Both the source well and the body well may be provided via ion implantation processes. A JFET region may also be provided in some embodiments. The JFET region is an area of increased carrier concentration adjacent to the body well and may also be provided by an ion implantation process.

Finally, a source contact, a drain contact, a gate insulator, and a gate contact are provided (step 110). The source contact is provided on the surface of the drift layer opposite the substrate and in electrical contact with the source well and the body well via the contact well. The drain contact is provided on the surface of the substrate opposite the drift layer and is in electrical contact with the substrate. The gate oxide is provided on the surface of the drift layer opposite the substrate over the JFET region, a portion of the body well, and a portion of the source well. The gate contact is provided on the gate oxide.

Figure 8:
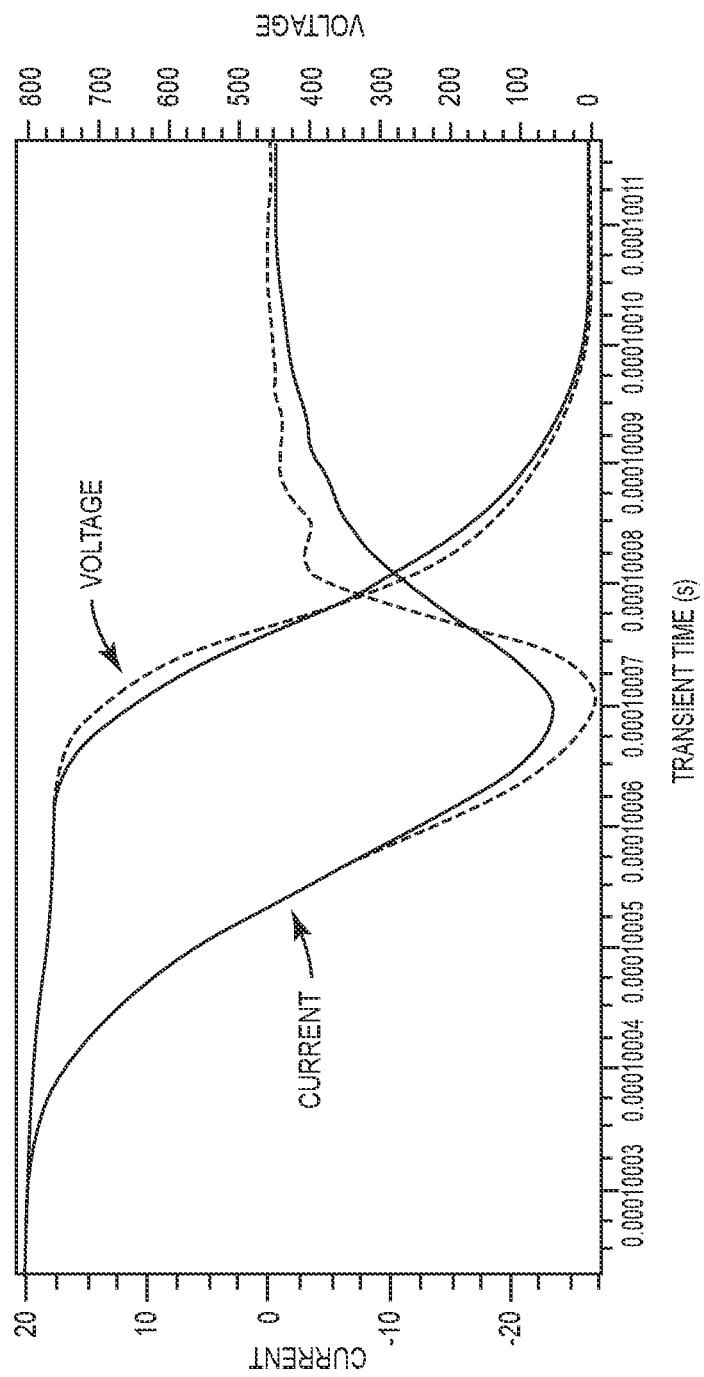
FIG. 8 is a graph illustrating the performance of a body diode of a transistor according to one embodiment of the present disclosure.

FIG. 8 is a graph comparing the reverse recovery of a conventional body diode within a transistor to a body diode including the improvements discussed herein to decrease snappiness. In particular, a solid line illustrates the current through and voltage across (each labeled on the graph) a body diode including the improvements discussed herein, while a dashed line illustrates the current through and voltage across a body diode in a conventional transistor. As shown, the improved body diode takes less time to reach its maximum reverse recovery current and the maximum reverse recovery current is significantly less than for the conventional body diode. The improved body diode also shows an extended time between the maximum reverse recovery current and 0.2 times the maximum reverse recovery time compared to the conventional body diode, and the slope of the current as it increases between these values is shallower than for the conventional diode. The current through the improved body diode also exhibits significantly less ringing than the conventional body diode. All of the above shows that the softness factor $S_1$ of the improved body diode ($t_s/t_f$ as discussed above) will be significantly improved in the improved body diode. Further, the secondary softness $S_2$ factor is also improved due to the relationship between the slope reverse recovery current, and the total area between the x-axis and the reverse recovery current curve is reduced. In short, the improved body diode is significantly less snappy than a conventional body diode. As discussed above, reduced snappiness means that the improved body diode can switch faster and with less switching losses compared to a conventional body diode.

As discussed above, a doping concentration of the drift layer 14 may be continuous along the thickness thereof (from top to bottom as shown in FIG. 1) or may vary according to a doping profile that changes along the thickness thereof. Further, in some embodiments the drift layer 14 may comprise multiple different layers, each having a different doping concentration and/or doping profile. In other embodiments, the transistor 10 may include a buffer layer, which is a layer having a particular doping profile within the drift layer 14. The buffer layer may be located between the drift layer 14 and the substrate 12 in some embodiments. Providing multiple drift layers and/or a buffer layer may increase the ruggedness of the transistor, in particular by reducing a second breakdown voltage thereof, and further may be used to design the body diode 30 such that it is a non-punch through diode or to change a distribution of minority carriers within the body diode 30 to decrease snappiness as discussed above.

Figure 9:
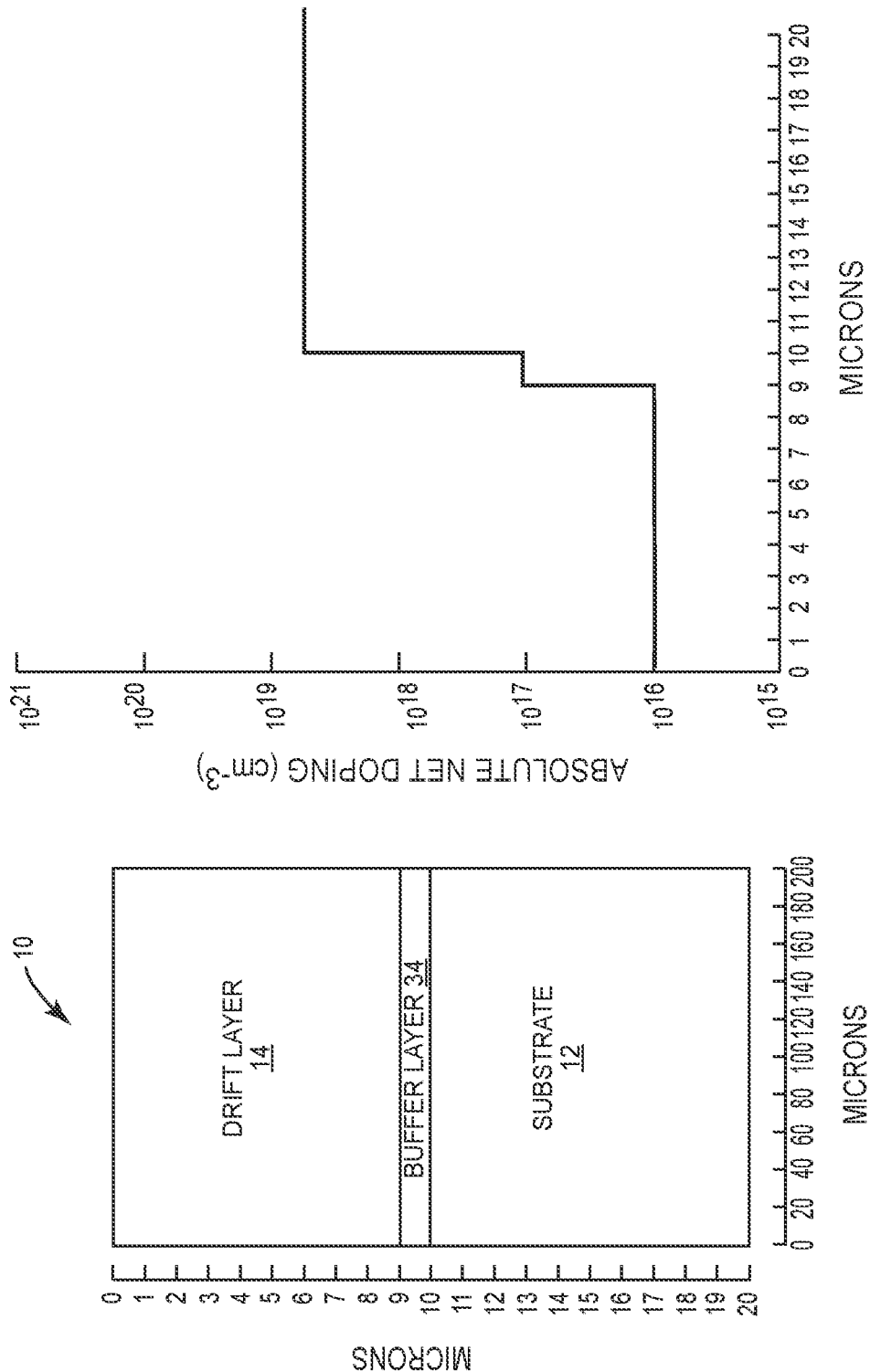
FIG. 9 illustrates a semiconductor device according to one embodiment of the present disclosure.

FIG. 9 shows a simplified version of the transistor 10 according to one embodiment of the present disclosure. The transistor 10 includes the substrate 12, a buffer layer 34 over the substrate 12, and the drift layer 14 over the buffer layer 34. A graph shows the relative doping concentrations of the substrate 12, the buffer layer 34, and the drift layer 14. As shown, the substrate 12 is more heavily doped than the buffer layer 34, which is in turn more heavily doped than the drift layer 14. In particular, the substrate 12, the buffer layer 34, and the drift layer 14 are all doped in a relatively consistent manner and thus form a step doping profile as shown. Providing the buffer layer 34 with a doping concentration that is higher than the drift layer 14 but lower than the substrate 12 creates a buffer for charge particles that may be accelerated by collisions with radiated particles, allowing these accelerated charge particles to recombine instead of passing through the transistor 10. This may improve the ruggedness of the transistor 10, and further such a tailored doping profile may be used to construct a desired profile of minority carriers in the device in order to decrease snappiness of the body diode 30 and thus improve the performance thereof.

Notably, the thickness and doping concentrations of the substrate 12, the buffer layer 34, and the drift layer 14 are merely exemplary. In particular, these thicknesses and doping concentrations are shown for a device rated for 1200 V. Those skilled in the art will readily appreciate that higher blocking voltages may dictate greater thicknesses for the drift layer 14, and in some embodiments, the buffer layer 34, and/or decreased doping concentrations for the same. However, the relationship between the thicknesses and doping concentrations of these layers will remain relatively unchanged. In one embodiment, a thickness of the buffer layer 34 may be between 5% and 35% the thickness of the drift layer 14. In specific embodiments, a thickness of the buffer layer 34 may be between 5% and 10% the thickness of the drift layer 14, between 10% and 15% the thickness of the drift layer 14, between 15% and 20% the thickness of the drift layer 14, between 20% and 25% the thickness of the drift layer, between 25% and 30% the thickness of the drift layer 14, between 30% and 35% the thickness of the drift layer 14, between 15% and 25% the thickness of the drift layer 14, and between 25% and 35% the thickness of the drift layer 14. Further, the doping concentration of the buffer layer 34 may vary between 20% and 90% the doping concentration of the substrate 12 while remaining greater than the doping concentration of the drift layer 14 by at least 20%. In specific embodiments, the doping concentration of the buffer layer 34 may be between 20% and 30% the doping concentration of the substrate 12, between 30% and 40% the doping concentration of the substrate 12, between 40% and 50% the doping concentration of the substrate 12, between 50% and 60% the doping concentration of the substrate 12, between 60% and 70% the doping concentration of the substrate 12, between 70% and 80% the doping concentration of the substrate 12, and between 80% and 90% the doping concentration of the substrate 12.

In one embodiment, the substrate 12, the buffer layer 34, and the drift layer 14 are silicon carbide (SiC). Accordingly, the buffer layer 34 may be an epitaxial layer that is grown on the substrate 12 before the drift layer 14. The drift layer 14 may then be grown over the buffer layer 34. The buffer layer 34 may be grown in an environment with dopants to provide the desired doping concentrations, or grown and subsequently implanted (e.g., via ion implantation) to the desired doping concentration. In other embodiments, the buffer layer 34 may be an implanted region in the surface of the substrate 12. Since the substrate 12 is more highly doped than the desired doping level for the buffer layer 34, the substrate 12 may be doped with an opposite doping type (e.g., if the substrate 12 is an n-type substrate, it may be doped with a p-dopant) to decrease the net doping concentration thereof. Notably, the principles of the present disclosure apply equally to n-type or p-type substrates, buffer layers, and drift layers. That is, the principles of the present disclosure may be equally applied to n-type and p-type devices.

Figure 10:
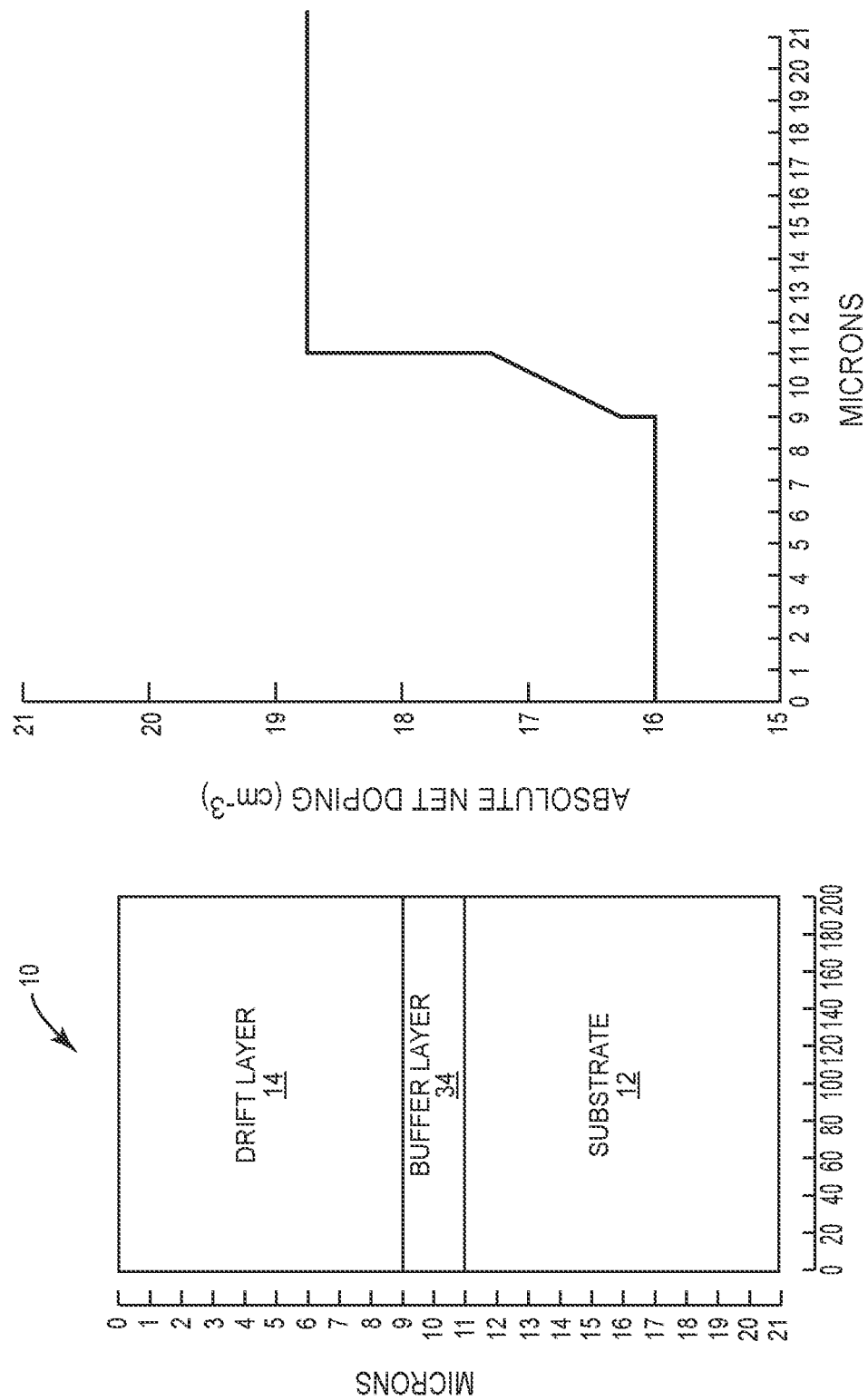
FIG. 10 illustrates a semiconductor device according to one embodiment of the present disclosure.

FIG. 10 shows a simplified version of the transistor 10 according to an additional embodiment of the present disclosure. The transistor 10 shown in FIG. 10 is substantially similar to that shown in FIG. 9, except for the doping profile of the device and the relative thicknesses of the layers. In particular, the buffer layer 34 provides a linearly graded doping concentration that decreases in proportion to a distance from the drift layer 14 such that the overall doping profile of the device includes a step between the drift layer 14 and the buffer layer 34 and another step between the buffer layer 34 and the substrate 12. In this embodiment, the buffer layer 34 may be thicker to allow for the linear transition in the doping profile thereof. Such a doping profile may be created by first growing the buffer layer 34 and then performing ion implantation on it, or by growing the buffer layer 34 in an environment wherein the concentration of dopants is controlled throughout the growth process. Notably, this doping profile is merely exemplary, and any linearly graded doping concentration may be substituted for the one shown in FIG. 10 without departing from the principles of the present disclosure.

Figure 11:
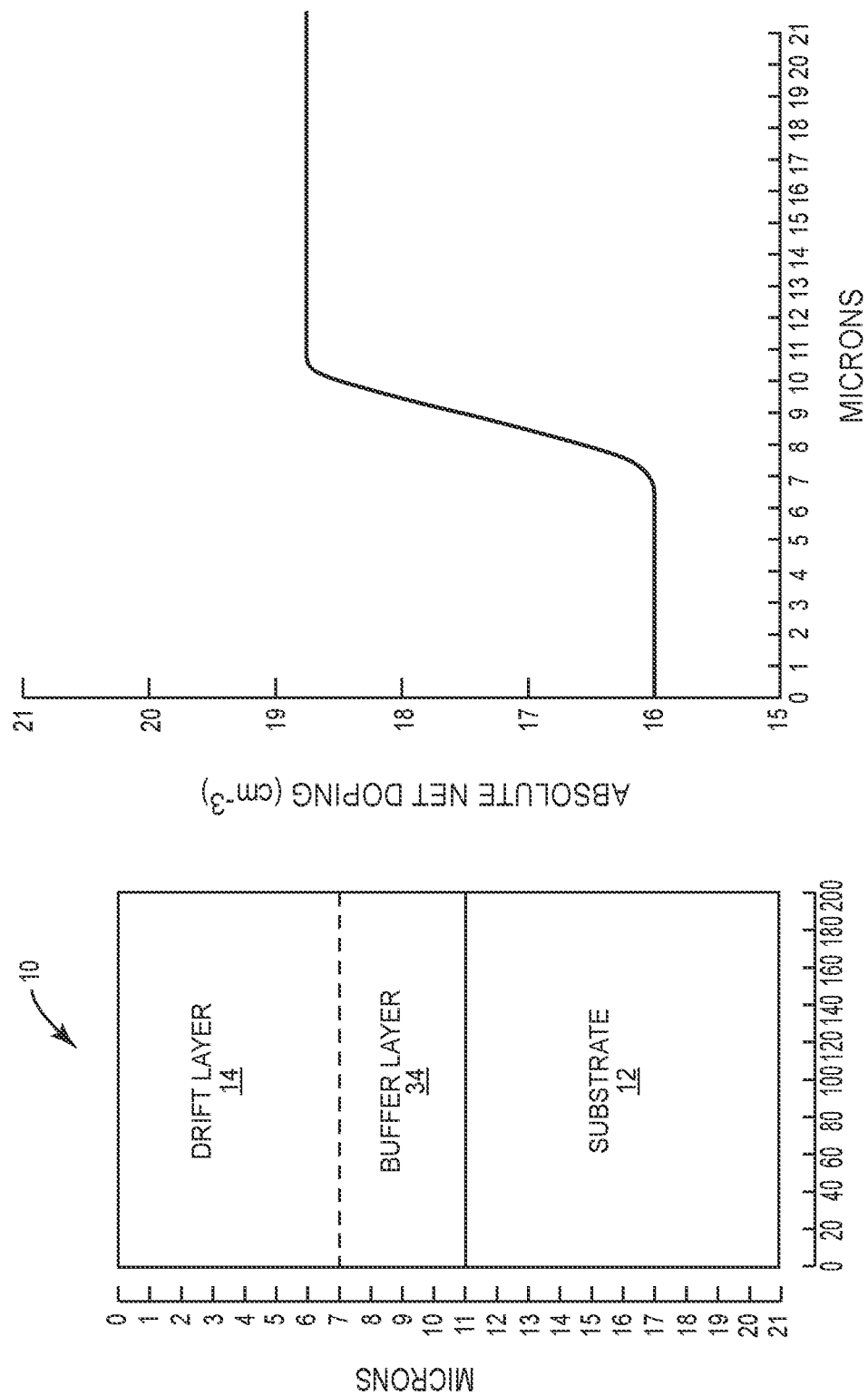
FIG. 11 illustrates a semiconductor device according to one embodiment of the present disclosure.

FIG. 11 shows a simplified version of the transistor 10 according to an additional embodiment of the present disclosure. The transistor 10 shown in FIG. 11 is substantially similar to that shown in FIG. 9 except for the doping profile of the device and the relative thicknesses of the layers. In particular, the buffer layer 34 provides a substantially smooth transition between the doping concentration of the drift layer 14 and the doping concentration of the substrate 12. In this embodiment, the buffer layer 34 may be substantially thicker to allow for the transition in the doping profile thereof. Such a doping profile may be created by first growing the buffer layer 34 and then performing ion implantation on it, or by growing the buffer layer 34 in an environment wherein the concentration of dopants is controlled throughout the growth process. Notably, this doping profile is merely exemplary, and any graded doping concentration, linear or otherwise, may be substituted for the one shown in FIG. 11 without departing from the principles of the present disclosure.

Figure 12:
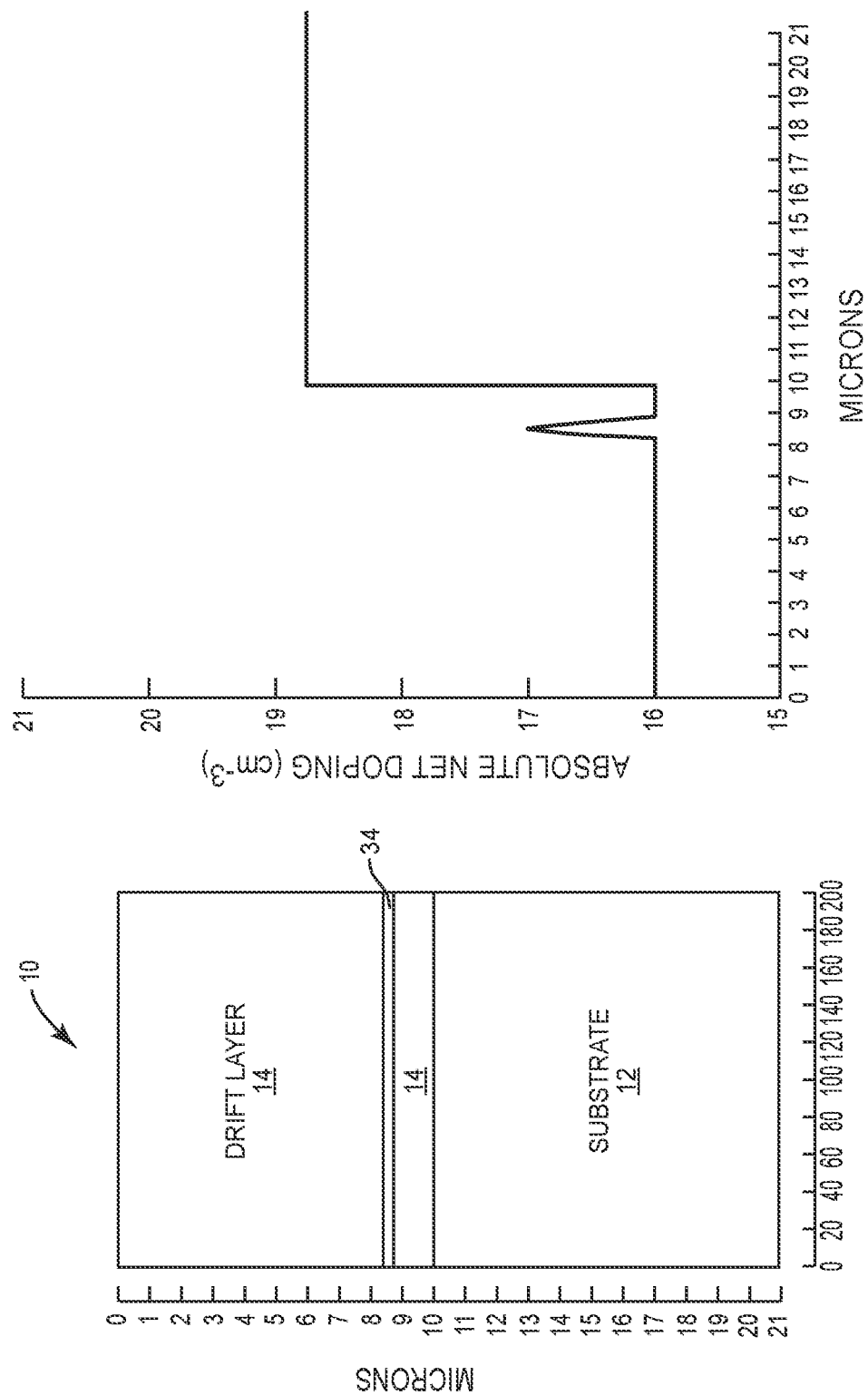
FIG. 12 illustrates a transistor according to one embodiment of the present disclosure.

FIG. 12 shows a simplified version of the transistor 10 according to an additional embodiment of the present disclosure. The transistor 10 shown in FIG. 12 is substantially similar to that shown in FIG. 9 except for the doping profile of the device and the relative thicknesses of the layers. In particular, the buffer layer 34 is provided as a doping "spike" and is not directly over the substrate 12. In this embodiment, the buffer layer 34 may be reduced in thickness. Such a doping profile may be formed either via separate growth on top of a small portion of the drift layer 14 or by growing a small portion of the drift layer 14, performing ion implantation to create the buffer layer 34, then growing the rest of the drift layer 14. Notably, this doping profile is merely exemplary, and any "spike" doping profile may be substituted for the one shown in FIG. 12 without departing from the principles of the present disclosure.

As illustrated in FIG. 13A, a relatively thin but higher doped spreading layer 36 is provided in certain instances over the drift layer 14 to help the current spread before reaching the lower-doped drift layer 14. As such, a typical SiC or other wide bandgap transistor 10 may have a thin, higher doped top region as the spreading layer 36; a thicker, lower doped drift layer 14, and a relatively thin substrate 12, which is shown thin in FIG. 13A to save space. FIG. 13B is a graph of the electric field within the vertical semiconductor versus distance from the top of the transistor 10. At avalanche, the electric field is highest at the top surface of the spreading layer 36 and drops in intensity through the spreading layer 36 and drift layer 14, although at different rates. Notably, the electric field remains at a significant level at the interface of the drift layer 14 and the substrate 12 (i.e., the top surface of the substrate 12). As such, the electric field effectively punches-through (PT) the entire drift layer 14, as illustrated in FIG. 13B. FIG. 13C illustrates that this type of punch through can occur well before avalanche breakdown, and the second breakdown can occur at a lower voltage than avalanche as well, for a structure such as this. In particular, FIG. 13C is a graph showing the electric field at the bottom of the drift layer 14, and the drain-source current (Ids), as the drain-source voltage (Vds) increased in a blocking mode for a FET or diode configuration of the transistor 10. The punch-through voltage V(PT) is observed, as well as the voltages for second breakdown and avalanche breakdown.

Figures 14A, 14B, 14C:
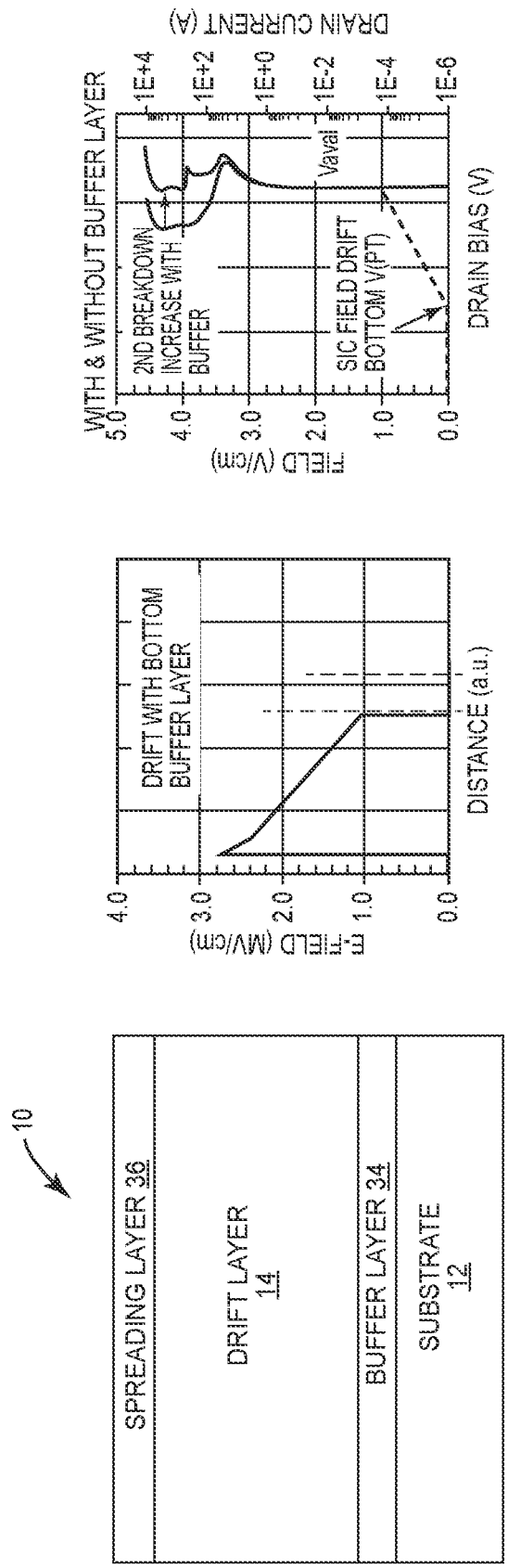
FIG. 14A illustrates a semiconductor device according to one embodiment of the present disclosure.
FIG. 14B is a graph illustrating the electric field in the semiconductor device for the embodiment of FIG. 14A.
FIG. 14C is graph illustrating the electric field at the bottom of the drift layer and the drain-source current as the drain-source voltage increases in a blocking state for the embodiment of FIG. 14A.

To avoid or mitigate the punch through of the electric field into the substrate, a buffer layer 34 may be employed with a spreading layer 36 as illustrated in FIG. 14A. The doping concentration of the buffer layer 34 may be between that of the drift layer 20 and substrate 12. Inclusion of the buffer layer 34 tends to keep the electric field away from the top surface of the substrate 12 and increases the second breakdown voltage. For the illustrated embodiment and as illustrated in FIG. 14B, the electric field at the avalanche voltage punches through the drift layer 14, but is stopped at the buffer layer 34, and as such does not punch through to the substrate 12. Inclusion of the buffer layer 34 increases the second breakdown voltage, which increases ruggedness in high-field bipolar conditions as well as keeps the electric field away from the substrate 12. Keeping the electric field away from the substrate minimizes the effects of basal plane dislocation motion from the substrate 12 into the drift layer 14. FIG. 14C illustrates the electric field at the bottom of the drift layer 14 and the drain-source current (Ids), as the drain-source voltage (Vds) increases in the blocking mode for a FET of diode configuration of the transistor 10. With the buffer layer 34, the avalanche (Vaval) and punch-through voltage V(PT) is unchanged; however, the voltage for second breakdown is significantly increased. Further, for the reasons discussed above, since the buffer layer 34 may prevent punch through of the electric field, it may improve the softness of the body diode 30.

For certain embodiments, the spreading layer 36 will generally range from $1\times10^{16}$ cm$^{-3}$ to $1\times10^{17}$ cm$^{-3}$ in doping level and between 1 µm and 4 µm in thickness depending on the desired current and voltage ratings. The doping for the drift layer 14 depends on the voltage rating of the device and can vary from $1\times10^{13}$ to $1\times10^{17}$ cm$^{-3}$ doping range and from 2 µm to 300 µm in thickness for devices rated from 300 V to 300 kV. The buffer layer 34 is generally lower in doping than the substrate 12, which is often doped at $1\times10^{18}$ cm$^{-3}$ or higher and is high enough not to significantly deplete in blocking. As such, the buffer layer 34 may range from $1\times10^{17}$ cm$^{-3}$ up to $5\times10^{18}$ cm$^{-3}$ and be 0.5 µm to 5 µm thick depending on the doping, in order to function as necessary. The thickness of the substrate 12 may range from 50 to 500 µm. The concept associated with the embodiment of FIG. 14A adds very little resistance to the structure, but aids in ruggedness performance and snappiness of the body diode 30 in some cases.

Alternative doping concentration ranges for the embodiment of FIG. 14A includes:
from $1\times10^{16}$ to $5\times10^{16}$ cm$^{-3}$ for the spreading layer 36;
from $1\times10^{13}$ to $1\times10^{17}$ cm$^{-3}$ for the drift layer 14;
from $5\times10^{16}$ to $5\times10^{16}$ cm$^{-3}$ for the buffer layer 34; and
from $5\times10^{17}$ to $1\times10^{20}$ cm$^{-3}$ for the substrate 12.

Figure 15C:
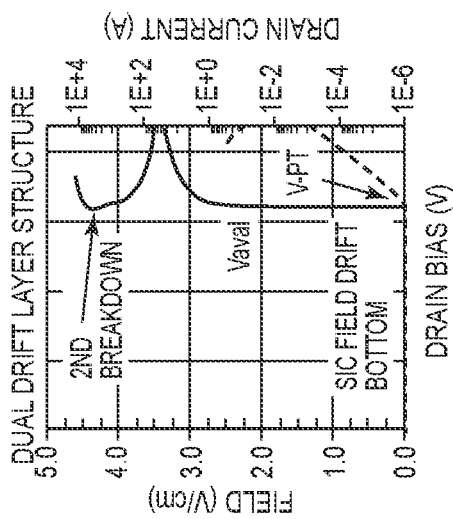
FIG. 15C is graph illustrating the electric field at the bottom of the drift layer and the drain-source current as the drain-source voltage increases in a blocking state for the embodiment of FIG. 15A.
Figure 15B:
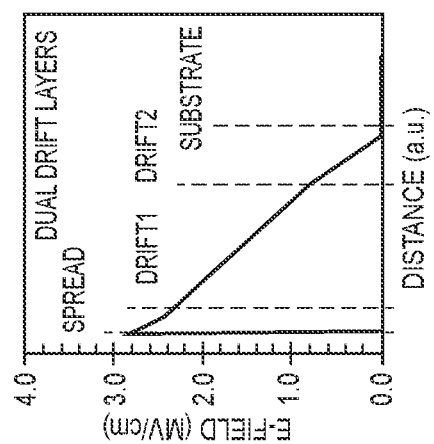
FIG. 15B is a graph illustrating the electric field in the semiconductor device for the embodiment of FIG. 15A.
Figure 15A:
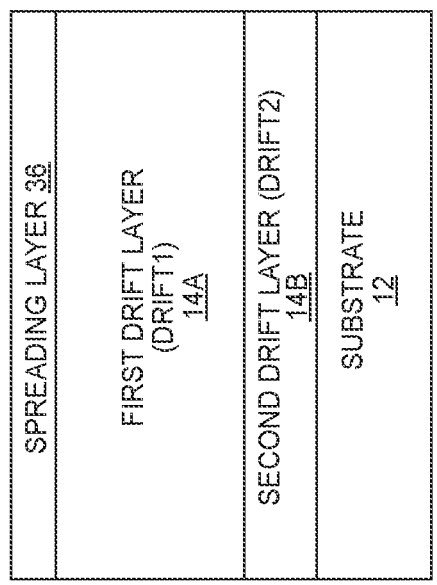
FIG. 15A illustrates a semiconductor device according to one embodiment of the present disclosure.

In the embodiment of FIG. 15A, multiple drift layers are provided in the transistor 10 and referenced as an upper, first drift layer 14A and a lower, second drift layer 14B. No buffer layer 34 is included. The first drift layer 14A resides between the spreading layer 36 and the second drift layer 14B. The second drift layer 14B resides between the first drift layer 14A and the substrate 12.

The lower, second drift layer 14B may have a doping level slightly higher than the upper, first drift layer 14A in an effort to thicken the drift from the prior embodiments. Further, first drift layer 14A can be thinner than the drift layer 14 of embodiment in FIG. 14A while having a slightly higher doping level to keep overall drift resistance low. Relative to the previous embodiment, these changes increase both the punch through voltage (V(PT)) and second breakdown voltage.

In certain embodiments, the second drift layer 14B may have a doping level that is one to three times that of the first drift layer 14A while being any thickness near or less than that of the first drift layer 14A. This embodiment provides increased ruggedness by not allowing as high of an electric field to penetrate into the substrate 12. In select embodiments, the first and second drift layers 14A, 14B of the transistor 10 can be designed to prevent any electric field from punching through the second drift layer 14B into the substrate 12, as shown in FIG. 15B. FIG. 15B illustrates the electric fields in the transistor 10 at the avalanche voltage. Notably, the electric field is stopped in the second drift layer 14B just shy of the substrate 12.

FIG. 15C illustrates the electric field at the bottom of the second drift layer 14B and the drain source current (Ids), as the drain-source voltage (Vds) increases in the blocking mode for a FET or diode configuration of the transistor 10. With the addition of the lower, second drift layer 14B, the avalanche voltage (Vaval) can be kept constant, while both the punch-through voltage V(PT) and the second breakdown voltage is increased beyond the avalanche voltage (Vaval).

The use of multiple drift layers, such as the first and second drift layers 14A, 14B can aid in overall device ruggedness under high field, high current, and fast switching conditions. Snappiness in switching is reduced and electric fields are kept out of the substrate 12 so that the basal plane dislocations will not move into the first or second drift layers 14A, 14B. More than two drift layers may be used to achieve similar results.

Exemplary doping concentration ranges for the embodiment of FIG. 15A includes:
from $1 \times 10^{16}$ to $5 \times 10^{16}$ cm$^{-3}$ for the spreading layer 36;
from $1 \times 10^{13}$ to $4 \times 10^{16}$ cm$^{-3}$ for the first drift layer 14A;
from $2 \times 10^{13}$ to $8 \times 10^{16}$ cm$^{-3}$ for the second drift layer 14B; and
from $5 \times 10^{17}$ to $1 \times 10^{20}$ cm$^{-3}$ for the substrate 12.

An alternative set of ranges includes:
from $1 \times 10^{16}$ to $5 \times 10^{16}$ cm$^{-3}$ for the spreading layer 36;
from $1 \times 10^{15}$ to $2 \times 10^{16}$ cm$^{-3}$ for the first drift layer 14A;
from $2 \times 10^{15}$ to $3 \times 10^{16}$ cm$^{-3}$ for the second drift layer 14B; and
from $1 \times 10^{18}$ to $1 \times 10^{20}$ cm$^{-3}$ for the substrate 12.

Exemplary thickness ranges include:
1-4 μm for the spreading layer 36;
2-50 μm for the first drift layer 14A;
1-30 μm for the second drift layer 14B; and
50-500 μm for the substrate 12.

Figures 16A, 16B, 16C:
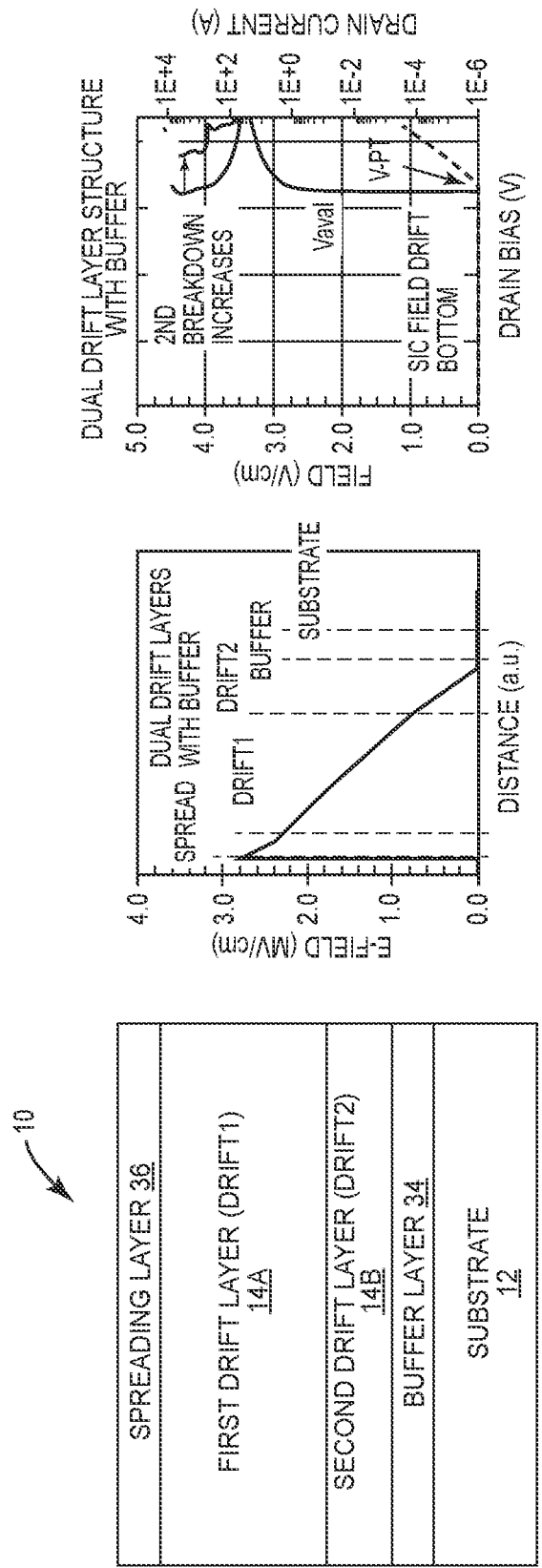
FIG. 16A illustrates a semiconductor device according to one embodiment of the present disclosure.
FIG. 16B is a graph illustrating the electric field in the semiconductor device for the embodiment of FIG. 16A.
FIG. 16C is graph illustrating the electric field at the bottom of the drift layer and the drain-source current as the drain-source voltage increases in a blocking state for the embodiment of FIG. 16A.

The embodiment illustrated in FIG. 16A builds on that of FIG. 15A by adding a buffer layer 34 between the second drift layer 14B and the substrate 12. As with the prior embodiment, the electric field at the avalanche voltage does not punch through the second drift layer 14B, and as such is stopped shy of the buffer layer 34, as shown in FIG. 16B. The additional benefits of this embodiment become more readily apparent in FIG. 16C. FIG. 16C illustrates the electric field at the bottom of the drift layer 14B and the Ids current as the drain-source voltage (Vds) increases in the blocking mode when the transistor 10 is configured as a FET or diode. With the added buffer layer 34, the avalanche voltage (Vaval) and the punch-through voltage (V(PT)) are kept relatively constant, while the second breakdown voltage is further increased to provide additional field lowering in high field, high current discharge conditions.

Exemplary doping concentration ranges for the embodiment of FIG. 16A includes:
from $1 \times 10^{16}$ to $5 \times 10^{16}$ cm$^{-3}$ for the spreading layer 36;
from $1 \times 10^{13}$ to $5 \times 10^{16}$ cm$^{-3}$ for the first drift layer 14A;
from $2 \times 10^{13}$ to $1 \times 10^{17}$ cm$^{-3}$ for the second drift layer 14B;
from $5 \times 10^{16}$ to $5 \times 10^{18}$ cm$^{-3}$ for the buffer layer 34; and
from $1 \times 10^{18}$ to $1 \times 10^{20}$ cm$^{-3}$ for the substrate 12.

An alternative set of ranges includes:
from $1 \times 10^{16}$ to $5 \times 10^{16}$ cm$^{-3}$ for the spreading layer 36;
from $1 \times 10^{15}$ to $2 \times 10^{16}$ cm$^{-3}$ for the first drift layer 14A;
from $2 \times 10^{15}$ to $3 \times 10^{16}$ cm$^{-3}$ for the second drift layer 14B;
from $1 \times 10^{17}$ to $1 \times 10^{18}$ cm$^{-3}$ for the buffer layer 34; and
from $1 \times 10^{18}$ to $1 \times 10^{20}$ cm$^{-3}$ for the substrate 12.

Exemplary thickness ranges include:
1-5 μm for the spreading layer 36;
2-50 μm for the first drift layer 14A;
1-30 μm for the second drift layer 14B;
1-20 μm for the buffer layer 34; and
50-500 μm for the substrate 12.

The first and second drift layers 14A and 14B may have the same or different doping concentrations as well as the same or different doping profiles. For example, both the first and second drift layers 14A and 14B may have graded or fixed doping concentrations that are the same or different. Further, either one of the first and second drift layers 14A and 14B may have a graded doping profile while the other one is fixed. In certain embodiments, the spreading layer 36 has a higher doping concentration than at least one, if not both, of the first and second drift layers.

The embodiment of FIG. 17A provides a transistor 10 with a drift layer 14 with graded doping. In the illustrated embodiment, there is only one drift layer 14 and no buffer layer 34. The doping concentration increases in the drift layer 14 from the bottom (i.e., substrate interface) to the top (i.e., spreading layer 36 interface) of the drift layer 14. As such, the doping concentration is slightly higher at the bottom of the drift layer 14 and lower near the top of the drift layer 14. As illustrated in FIG. 17B, the doping concentration is relatively level throughout the spreading layer 36, drops to a first level at the top of the drift layer 14, increases continuously throughout the drift layer 14 to a level at or below the spreading layer 36, and jumps up to a much higher and relatively fixed level in the substrate 12. The doping concentrations in FIG. 17B are shown on a log scale.

With the right doping concentration, profile, and thickness, an increase in both the punch through voltage (V(PT)) and the second breakdown voltage is provided, as illustrated in FIG. 17C. With the graded drift layer 14, the avalanche voltage (Vaval) can be kept constant, while the second breakdown voltage and the punch-through voltage V(PT) is increased beyond the avalanche voltage (Vaval) limit. This provides additional field lowering in high field, high current discharge conditions.

Ruggedness under high field, high current, and fast switching conditions is increased by not allowing any or as high of a field to penetrate into the substrate 12. Bipolar device snappiness in switching is also reduced. As in the other embodiments, keeping the electric fields out of the substrate 12 prevents basal plane dislocations from moving into the drift layer 14.

Exemplary doping concentration ranges for the embodiment of FIGS. 17A and 17B includes:
from $1 \times 10^{16}$ to $5 \times 10^{16}$ cm$^{-3}$ for the spreading layer 36;
from between $1 \times 10^{13}$ and $5 \times 10^{18}$ cm$^{-3}$ to between $1 \times 10^{15}$ and $5 \times 10^{17}$ cm$^{-3}$ for the drift layer 14; and
from $1 \times 10^{18}$ to $1 \times 10^{20}$ cm$^{-3}$ for the substrate 12.

An alternative set of ranges includes:
from $1 \times 10^{16}$ to $5 \times 10^{16}$ cm$^{-3}$ for the spreading layer 36;
from between $5 \times 10^{15}$ and $5 \times 10^{17}$ cm$^{-3}$ to between $1 \times 10^{16}$ and $1 \times 10^{17}$ cm$^{-3}$ for the drift layer 14; and
from $1 \times 10^{18}$ to $5 \times 10^{19}$ cm$^{-3}$ for the substrate 12.

Exemplary thickness ranges include:
1-5 μm for the spreading layer 36;
3-200 μm for the drift layer 14; and
50-500 μm for the substrate 12.

Figure 18B:
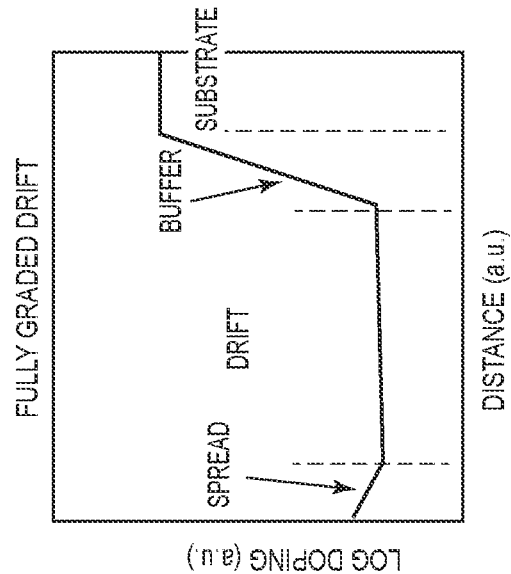
FIG. 18B is a graph illustrating the relative graded doping concentration levels throughout the various layers of the vertical semiconductor device for the embodiment in FIG. 18A.
Figure 18A:
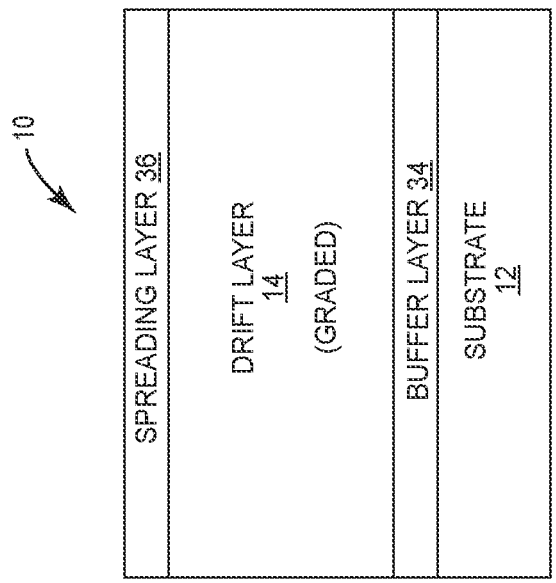
FIG. 18A illustrates a power device according to one embodiment of the present disclosure.

Turning now to FIG. 18A, a buffer layer 34 and graded drift layer 14 are provided between the spreading layer 36 and the substrate 12. In this embodiment, the spreading layer 36 and the buffer layer 34 are uniformly doped and the drift layer 14 is graded as described above. In other embodiments, the doping for the spreading layer 36 and/or the buffer layer 34 is graded. The graph of FIG. 18B provides an exemplary doping profile on a log scale. As illustrated in FIG. 18B, the doping concentration decreases continuously from a first level at the top of the spreading layer 36 to a second level at the bottom of the spreading layer 36; increases continuously from the second level at the top of the drift layer 14 to a third level, which is lower than the first level, at the bottom of the drift layer 14; increases continuously from the second level throughout the buffer layer 34 to a fourth level. The doping throughout the substrate 12 is shown to be uniform at the fourth level. In the illustrated embodiment, the doping levels throughout the illustrated layers are continuous in that there are no abrupt changes in doping concentrations within a given layer or at the junction of layers.

Exemplary doping concentration ranges for a fully graded embodiment include:
- from between $5 \times 10^{16}$ and $1 \times 10^{14}$ cm$^{-3}$ to between $3 \times 10^{16}$ and $5 \times 10^{15}$ cm$^{-3}$ for the spreading layer 36;
- from between $1 \times 10^{13}$ and $1 \times 10^{17}$ cm$^{-3}$ to between $5 \times 10^{15}$ and $5 \times 10^{16}$ cm$^{-3}$ for the drift layer 14;
- from between $5 \times 10^{16}$ and $1 \times 10^{20}$ cm$^{-3}$ to $1 \times 10^{17}$ and $1 \times 10^{20}$ cm$^{-3}$ for the buffer layer 34; and
- from $1 \times 10^{18}$ to $1 \times 10^{20}$ cm$^{-3}$ for the substrate 12.

Exemplary thickness ranges include:
- 1-5 μm for the spreading layer 36;
- 3-200 μm for the drift layer 14;
- 1-20 μm for the buffer layer 34; and
- 50-500 μm for the substrate 12.

The characteristics, thicknesses, doping concentrations, relationships of the thicknesses and/or doping concentrations and the like for the substrate 12, buffer layer 34, and drift layer 14 for the embodiments in FIGS. 9 through 12 may, but need not, be applied to any of the embodiments of FIGS. 13 through 18, and vice versa.

The use of multiple drift layers, the buffer layer 34, and the spreading layer 36 as discussed above with respect to FIGS. 9 through 18 may not only improve the ruggedness of the transistor 10 but also decrease the snappiness of the body diode 30. First, the various configurations of the drift layer 14, the buffer layer 34, and the spreading layer 36 may prevent punch-through and thus improve the performance of the body diode 30 as discussed above. Additionally, the various configurations of the drift layer 14, the buffer layer 34, and the spreading layer 36 may be designed to provide a desired distribution of minority carriers in order to reduce snappiness as discussed above with respect to FIG. 4.

Figure 19:
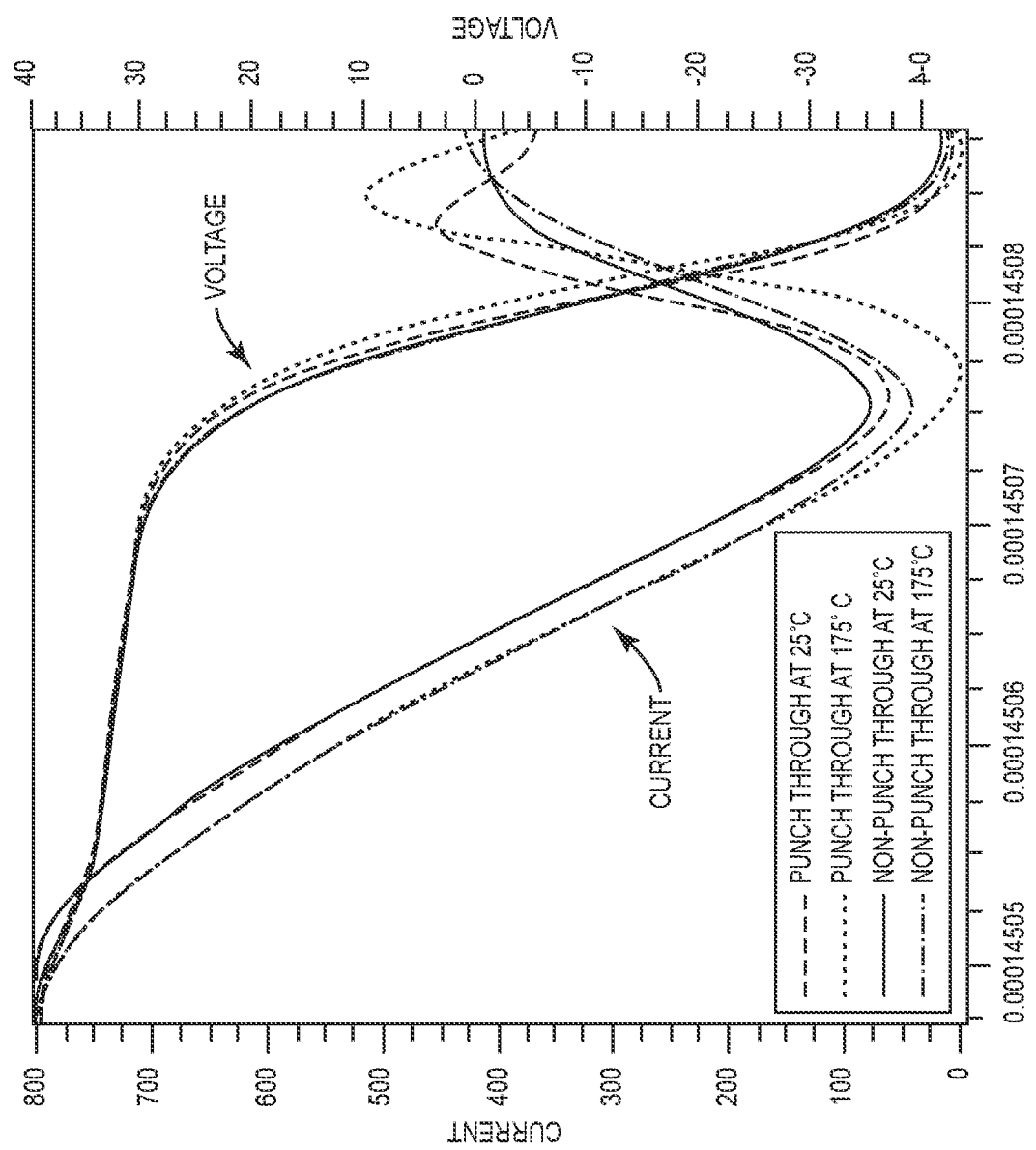
FIG. 19 is a graph illustrating the response of a body diode according to various embodiments of the present disclosure.

FIG. 19 is a graph illustrating the effect of providing the body diode 30 as a non-punch through diode according to one embodiment of the present disclosure. In particular, the graph shows portions of a voltage and current transient response for the body diode 30 when provided as a punch through diode and a non-punch through diode. A dashed line illustrates the response of the body diode 30 at 25° C. when provided as a punch through diode. A dotted line illustrates the response of the body diode 30 at 175° C. when provided as a punch through diode. A solid line illustrates the response of the body diode 30 at 25° C. when provided as a non-punch through diode. As discussed above, this may be achieved by modifying the thickness and doping concentration of the drift layer 14, as an example. A dashed and dotted line illustrates the response of the body diode 30 at 175° C. when provided as a non-punch through diode. As illustrated, the response of the body diode 30 is softer when provided as a non-punch through diode at both 25° C. and 175° C.

Figure 20:
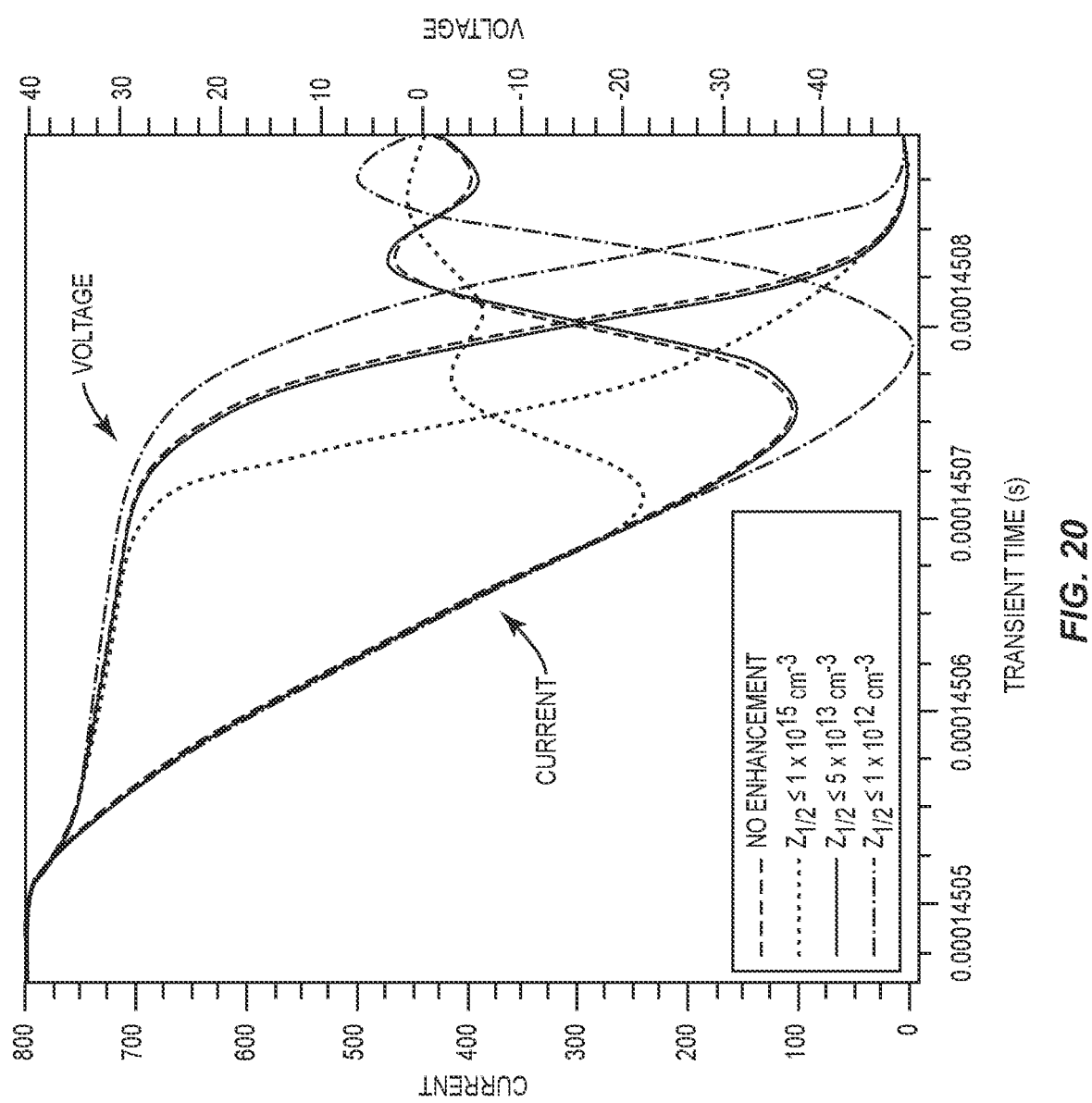
FIG. 20 is a graph illustrating the response of a body diode according to various embodiments of the present disclosure.

FIG. 20 is a graph illustrating the effect of carrier lifetime of the drift layer 14 in the body diode 30. In particular, the graph shows portions of a voltage and current transient response for the body diode 30 when provided with different carrier lifetimes in the drift layer 14. A dashed line, which is largely obscured by a solid line discussed below, shows the response of the body diode 30 with no carrier lifetime enhancement. A dotted line illustrates the response of the body diode 30 with carrier lifetime enhancement such that a density of $Z_{1/2}$ traps in the drift layer 14 is less than or equal to $1 \times 10^{15}$ cm$^{-3}$. A solid line illustrates the response of the body diode 30 with carrier lifetime enhancement such that a density of $Z_{1/2}$ traps in the drift layer 14 is less than or equal to $5 \times 10^{13}$ cm$^{-3}$. A dotted and dashed line illustrates the response of the body diode 30 with carrier lifetime enhancement such that a density of $Z_{1/2}$ traps in the drift layer 14 is less than or equal to $1 \times 10^{12}$ cm$^{-3}$. Carrier lifetime is related to $Z_{1/2}$ trap density because these traps act as recombination centers for carriers. By reducing $Z_{1/2}$ trap density, for example, as discussed above by thermal oxidation, carrier lifetime can be improved, which may reduce snappiness and thus improve softness of the body diode 30. Notably, the graph in FIG. 20 shows the response of the body diode 30 as a punch through diode.

Figure 21:
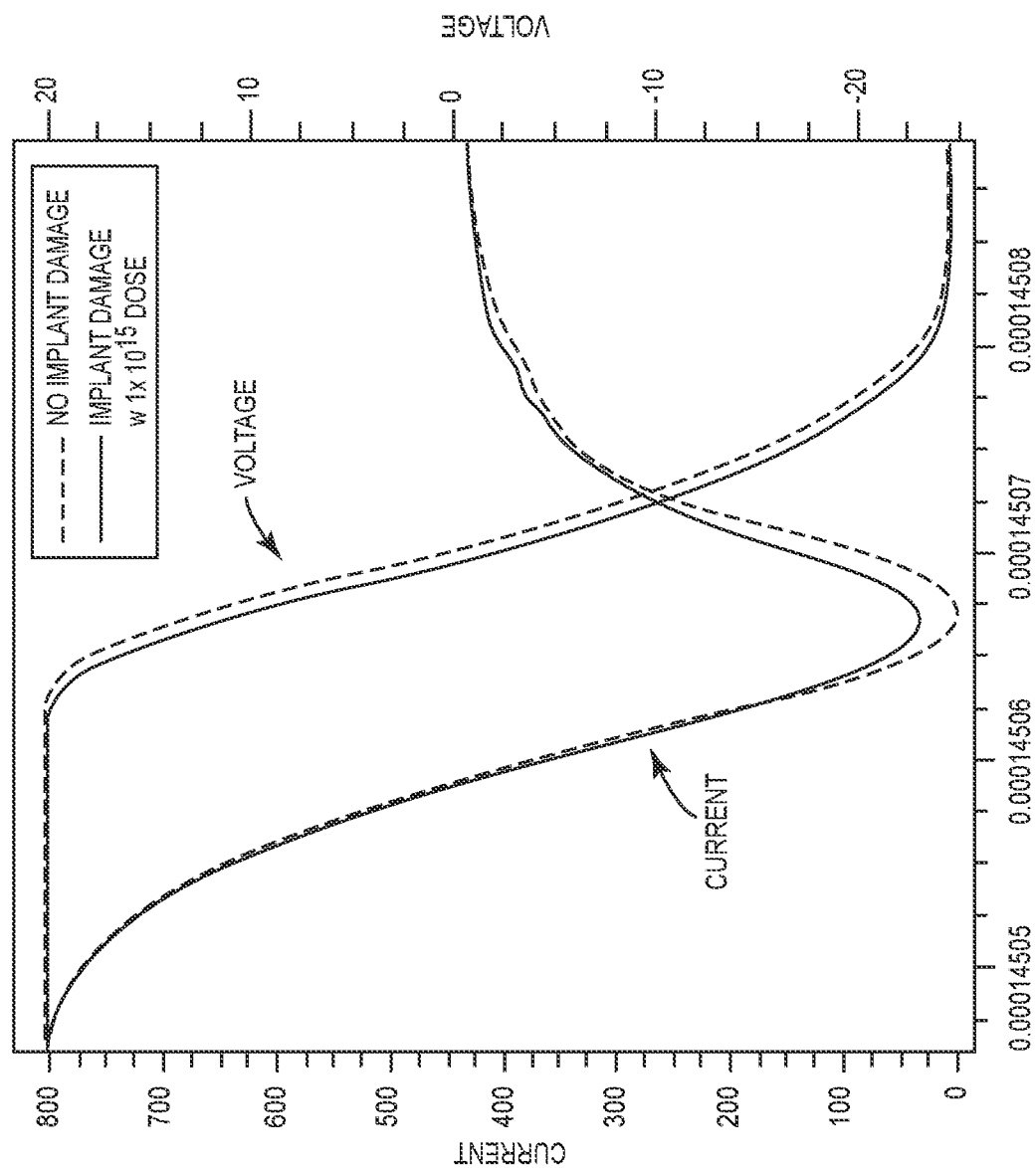
FIG. 21 is a graph illustrating the response of a body diode according to various embodiments of the present disclosure.

FIG. 21 is a graph illustrating the effect of the recombination region 32 on the body diode 30. In particular, the graph shows portions of a voltage and current transient response for the body diode 30 when provided with and without the recombination region 32. A dashed line shows the response of the body diode 30 without the recombination region 32, while a solid line shows the response of the body diode 30 with the recombination region 32. Notably, the graph shows the response of the body diode 30 as a non-punch through diode and wherein the drift layer 14 includes enhanced carrier lifetime. As shown, providing the recombination region 32 improves softness of the body diode 30.

Those skilled in the art will recognize improvements and modifications to the preferred embodiments of the present disclosure. All such improvements and modifications are considered within the scope of the concepts disclosed herein and the claims that follow.

What is claimed is:

1. A semiconductor device comprising:
   a substrate;
   a drift layer on the substrate, the drift layer having a minority carrier lifetime between 1 μs and 20 μs; and
   one or more implanted regions in the drift layer, the one or more implanted regions configured to:
     provide a vertical transistor device configured to conduct current in a first direction; and
     provide a body diode configured to conduct current in a second direction opposite the first direction,
   wherein the drift layer has a first doping type and a first doping concentration;
   wherein the one or more implanted regions comprise a body well having a second doping type opposite the first doping type and a second doping concentration; and
   wherein the first and second doping concentrations and a thickness of the drift layer are configured so that a softness factor of the body diode is between 0.5 and 10.

2. The semiconductor device of claim 1 wherein a density of $Z_{1/2}$ traps in the drift layer is less than $5 \times 10^{13}$ cm$^{-3}$.

3. The semiconductor device of claim 1 further comprising a recombination region in the drift layer, wherein a density of minority carrier recombination centers in the recombination region is between $1 \times 10^{13}$ cm$^{-3}$ and $1 \times 10^{18}$ cm$^{-3}$.

4. The semiconductor device of claim 3 wherein a thickness of the recombination region is between 1 nm and 360 μm.

5. The semiconductor device of claim 4 wherein:
   the substrate has a first doping type and a first doping concentration;
   the drift layer has the first doping type and a second doping concentration; and
   the one or more implanted regions comprise:
     a body well having a second doping type opposite the first doping type; and a source well having the first doping type, wherein the source well is within the body well.

6. The semiconductor device of claim 5 wherein the recombination region borders the one or more implanted regions in the drift layer.

7. The semiconductor device of claim 6 wherein the recombination region encapsulates the one or more implanted regions in the drift layer.

8. The semiconductor device of claim 6 wherein a width of the recombination region is less than a width of a widest portion of the one or more implanted regions.

9. The semiconductor device of claim 6 wherein a width of the recombination region is equal to a width of a widest portion of the one or more implanted regions.

10. The semiconductor device of claim 6 wherein a width of the recombination region is larger than a width of a widest portion of the one or more implanted regions.

11. The semiconductor device of claim 1 wherein the body diode is a non-punch through diode.

12. The semiconductor device of claim 1 wherein the vertical transistor device is a metal-oxide-semiconductor field-effect transistor (MOSFET).

13. The semiconductor device of claim 12 wherein the semiconductor device comprises silicon carbide.

14. The semiconductor device of claim 1 wherein the drift layer comprises:
 a first drift layer having a first doping type and a first doping profile; and
 a second drift layer having the first doping type and a second doping profile that is different than the first doping profile.

15. The semiconductor device of claim 14 wherein the second drift layer is between the substrate and the first drift layer and a doping concentration of the second drift layer is greater than a doping concentration of the first drift layer and less than a doping concentration of the substrate.

16. A semiconductor device comprising:
 a substrate;
 a drift layer on the substrate, the drift layer comprising:
  a first drift layer having a first doping type and a first doping profile; and
  a second drift layer having the first doping type and a second doping profile that is different than the first doping profile, wherein the second drift layer is between the substrate and the first drift layer and a doping concentration of the second drift layer is greater than a doping concentration of the first drift layer and less than a doping concentration of the substrate;
 a buffer layer between the second drift layer and the substrate, wherein the buffer layer has the first doping type and a doping concentration that is greater than the doping concentration of the second drift layer and less than the doping concentration of the substrate; and
 one or more implanted regions in the drift layer, the one or more implanted regions configured to:
  provide a vertical transistor device configured to conduct current in a first direction; and
  provide a body diode configured to conduct current in a second direction opposite the first direction.

17. The semiconductor device of claim 16 further comprising a spreading layer on the first drift layer, wherein the spreading layer has the first doping type and a doping concentration that is greater than the doping concentration of the first drift layer.

18. The semiconductor device of claim 1 wherein:
 the drift layer has a first doping type; and
 the semiconductor device further comprises a buffer layer between the drift layer and the substrate, the buffer layer having the first doping type and a doping concentration that is greater than a doping concentration of the drift layer and less than a doping concentration of the substrate.

19. The semiconductor device of claim 18 further comprising a spreading layer on the drift layer, wherein the spreading layer has the first doping type and a doping concentration that is greater than the doping concentration of the drift layer.

20. A semiconductor device comprising:
 a substrate;
 a drift layer on the substrate;
 one or more implanted regions in the drift layer, the one or more implanted regions configured to:
  provide a vertical transistor device configured to conduct current in a first direction; and
  provide a body diode configured to conduct current in a second direction opposite the first direction; and
 a recombination region bordering the one or more implanted regions in the drift layer, wherein a density of minority carrier recombination centers in the recombination region is between $1\times10^{13}$ cm$^{-3}$ and $1\times10^{18}$ cm$^{-3}$, and wherein the density of minority carrier recombination centers in the recombination region is between five to ten times greater than that of the drift layer.

21. A semiconductor device comprising:
 a substrate;
 a drift layer on the substrate;
 one or more implanted regions in the drift layer, the one or more implanted regions configured to:
  provide a vertical transistor device configured to conduct current in a first direction; and
  provide a body diode configured to conduct current in a second direction opposite the first direction; and
 a recombination region bordering the one or more implanted regions in the drift layer, wherein a density of minority carrier recombination centers in the recombination region is between $1\times10^{13}$ cm$^{-3}$ and $1\times10^{18}$ cm$^{-3}$, and wherein the density of minority carrier recombination centers in the recombination region is between five to ten times greater than that of the drift layer,
 wherein the drift layer has a first doping type and a first doping concentration;
 wherein the one or more implanted regions comprise a body well having a second doping type opposite the first doping type and a second doping concentration; and
 wherein the first and second doping concentrations and a thickness of the drift layer are configured so that a softness factor of the body diode is between 0.5 and 10.

22. The semiconductor device of claim 20 wherein the density of minority carrier recombination centers in the recombination region is greater than $5\times10^{15}$ cm$^{-3}$.

23. The semiconductor device of claim 20 wherein a minority carrier lifetime within the drift layer is between 1 µs and 20 µs.

24. The semiconductor device of claim 23 wherein a density of $Z_{1/2}$ traps in the drift layer is less than $5\times10^{13}$ cm$^{-3}$.

25. The semiconductor device of claim 23 wherein the body diode is a non-punch through diode.

26. The semiconductor device of claim 20 wherein:
the substrate has a first doping type and a first doping concentration;
the drift layer has the first doping type and a second doping concentration; and
the one or more implanted regions comprise:
- a body well having a second doping type opposite the first doping type; and
- a source well having the first doping type, wherein the source well is within the body well.

27. The semiconductor device of claim 26 wherein the recombination region borders the one or more implanted regions in the drift layer.

28. A semiconductor device comprising:
a substrate;
a drift layer on the substrate and having a first doping type, wherein:
- the drift layer comprises a wide bandgap semiconductor material; and
- a density of $Z_{1/2}$ traps in the drift layer is less than $5 \times 10^{13}$ cm$^{-3}$;
one or more implanted regions in the drift layer and comprising a body well having a second doping type opposite the first doping type, the one or more implanted regions configured to:
provide a vertical transistor device configured to conduct current in a first direction; and
provide a body diode configured to conduct current in a second direction opposite the first direction; and
a recombination region in the drift layer, wherein at least a portion of the recombination region is between a lower surface of the body well and the substrate.

29. The semiconductor device of claim 28 wherein the density of $Z_{1/2}$ traps in the drift layer is less than $1 \times 10^{13}$ cm$^{-3}$.

30. The semiconductor device of claim 28 wherein the wide bandgap semiconductor material comprises silicon carbide.

31. A semiconductor device comprising:
a substrate;
a drift layer on the substrate;
one or more implanted regions in the drift layer, the one or more implanted regions configured to:
provide a vertical transistor device configured to conduct current in a first direction; and
provide a body diode configured to conduct current in a second direction opposite the first direction; and
a recombination region bordering the one or more implanted regions in the drift layer, wherein a density of minority carrier recombination centers in the recombination region is between $1 \times 10^{13}$ cm$^{-3}$ and $1 \times 10^{18}$ cm$^{-3}$, and wherein the density of minority carrier recombination centers in the recombination region is between five to ten times greater than that of the drift layer,
wherein the density of minority carrier recombination centers in the recombination region peaks at an interface between the drift layer and the body well.

* * * * *

UNITED STATES PATENT AND TRADEMARK OFFICE
CERTIFICATE OF CORRECTION

PATENT NO. : 11,990,543 B2
APPLICATION NO. : 17/208271
DATED : May 21, 2024
INVENTOR(S) : Han et al.

It is certified that error appears in the above-identified patent and that said Letters Patent is hereby corrected as shown below:

In the Specification

Column 5, Line 50: Please correct "$1\times10^{1s}$ cm$^{-3}$" to read --$1\times10^{15}$ cm$^{-3}$--

Column 7, Lines 20-25: Please delete "where a higher value of the secondary softness factor is desirable. Yet another way to quantify the snappiness of softness of a diode is by looking at the area between x-axis (zero current) and the negative reverse recovery current curve. It is generally desirable to minimize this area."

Column 11, Lines 32-34: Please correct "and $3\times10^{19}$ cm$^{-3}$, between $5\times10^{17}$ cm$^{-3}$, between $1\times10^{19}$ cm$^{-3}$ and $1\times10^{17}$cm$^{-3}$," to read --and $3\times10^{19}$ cm$^{-3}$, between $1\times10^{16}$ cm$^{-3}$ and $1\times10^{19}$ cm$^{-3}$, between $1\times10^{16}$ cm$^{-3}$ and $5\times10^{18}$ cm$^{-3}$, between $1\times10^{16}$ cm$^{-3}$ and $1\times10^{18}$ cm$^{-3}$, between $1\times10^{16}$ cm$^{-3}$ and $5\times10^{17}$ cm$^{-3}$, between $1\times10^{16}$ cm$^{-3}$ and $1\times10^{17}$ cm$^{-3}$,--

Column 18, Line 26: Please correct "from $5\times10^{16}$ to $5\times10^{16}$ cm$^{-3}$" to read --from $5\times10^{16}$ to $5\times10^{18}$ cm$^{-3}$--

Signed and Sealed this
Eighth Day of July, 2025

Coke Morgan Stewart
*Acting Director of the United States Patent and Trademark Office*